(12) United States Patent
Liaw

(10) Patent No.: US 11,145,599 B2
(45) Date of Patent: Oct. 12, 2021

(54) METHOD OF FABRICATING A MEMORY DEVICE HAVING MULTIPLE METAL INTERCONNECT LINES

(71) Applicant: Taiwan Semiconductor Manufacturing Co., Ltd., Hsinchu (TW)

(72) Inventor: Jhon Jhy Liaw, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/723,323

(22) Filed: Dec. 20, 2019

(65) Prior Publication Data

US 2020/0126905 A1  Apr. 23, 2020

Related U.S. Application Data

(62) Division of application No. 16/048,262, filed on Jul. 28, 2018, now Pat. No. 10,522,462, which is a
(Continued)

(51) Int. Cl.
*H01L 23/528* (2006.01)
*H01L 27/108* (2006.01)
*H01L 27/11* (2006.01)
*H01L 27/112* (2006.01)
*H01L 21/768* (2006.01)
*H01L 23/522* (2006.01)

(52) U.S. Cl.
CPC ...... *H01L 23/528* (2013.01); *H01L 21/76816* (2013.01); *H01L 21/76877* (2013.01); *H01L 23/5226* (2013.01); *H01L 27/10805* (2013.01); *H01L 27/10897* (2013.01); *H01L 27/1104* (2013.01); *H01L 27/1116* (2013.01); *H01L 27/11213* (2013.01); *H01L 27/11293* (2013.01)

(58) Field of Classification Search
CPC ............ H01L 23/528; H01L 27/11293; H01L 27/1116; H01L 27/10897; H01L 27/10805; H01L 21/76877; H01L 21/76816; H01L 27/11213; H01L 27/1104; H01L 23/5226; H01L 27/112; H01L 27/11; H01L 27/108; H01L 23/522; H01L 21/768
USPC ....................................................... 257/758
See application file for complete search history.

(56) References Cited

U.S. PATENT DOCUMENTS 6,535,453 B2   3/2003  Nii et al.
6,590,802 B2   7/2003  Nii
(Continued)

FOREIGN PATENT DOCUMENTS

CN   102768848 A   11/2012
CN   103310833 A   9/2013
(Continued)

*Primary Examiner* — Alexander O Williams
(74) *Attorney, Agent, or Firm* — Haynes and Boone, LLP

(57) ABSTRACT

Provided is a memory device including an array of memory cells. A first bit-line coupled to memory cells of a first column of the array of memory cells. The first bit-line is disposed on a first metal layer. A second bit-line is coupled to the first bit-line. The second bit-line is disposed on a second metal layer and coupled to the first bit-line by at least one via. A word line is coupled to a row of the array of memory cells.

18 Claims, 24 Drawing Sheets

Related U.S. Application Data division of application No. 15/353,618, filed on Nov. 16, 2016, now Pat. No. 10,074,605.

(60) Provisional application No. 62/356,764, filed on Jun. 30, 2016.

(56) References Cited

U.S. PATENT DOCUMENTS

| | | | |
|---|---|---|---|
| 8,097,504 B2 | 1/2012 | Mokhlesi et al. | |
| 8,605,523 B2 | 12/2013 | Tao et al. | |
| 8,630,132 B2 | 1/2014 | Cheng et al. | |
| 8,691,633 B2 | 4/2014 | Liaw | |
| 8,760,948 B2 | 6/2014 | Tao et al. | |
| 9,691,471 B2 | 6/2017 | Liaw | |
| 9,721,645 B1 * | 8/2017 | Liaw | G11C 11/412 |
| 9,786,378 B1 * | 10/2017 | Zhang | G11C 16/26 |
| 2001/0043483 A1 | 11/2001 | Yang | |
| 2005/0007849 A1 | 1/2005 | Sommer | |
| 2005/0083765 A1 | 4/2005 | Jeong et al. | |
| 2006/0046404 A1 | 3/2006 | Lee et al. | |
| 2007/0200182 A1 | 8/2007 | Liaw | |
| 2010/0260000 A1 | 10/2010 | Sridhara | |
| 2011/0068400 A1 * | 3/2011 | Wang | G11C 11/412 257/347 |
| 2011/0195564 A1 | 8/2011 | Liaw et al. | |
| 2013/0021864 A1 | 1/2013 | Deng et al. | |
| 2013/0107608 A1 | 5/2013 | Mann et al. | |
| 2013/0181297 A1 | 7/2013 | Liaw | |
| 2013/0193516 A1 * | 8/2013 | Goldbach | H01L 21/76897 257/368 |
| 2013/0235640 A1 | 9/2013 | Liaw | |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2014/0347908 A1 | 11/2014 | Liaw | |
| 2015/0200199 A1 | 7/2015 | Sakamoto et al. | |
| 2015/0296329 A1 | 10/2015 | Mao et al. | |
| 2015/0370950 A1 * | 12/2015 | Kawa | H01L 21/823871 716/119 |
| 2016/0093671 A1 | 3/2016 | Roy | |
| 2016/0125919 A1 | 5/2016 | Hush | |
| 2016/0372182 A1 | 12/2016 | Liaw | |
| 2017/0032835 A1 | 2/2017 | Liaw | |
| 2017/0221552 A1 | 8/2017 | Liaw | |
| 2017/0221905 A1 | 8/2017 | Chen et al. | |
| 2017/0301678 A1 | 10/2017 | Nii | |
| 2018/0005938 A1 | 1/2018 | Liaw | |
| 2018/0122812 A1 | 5/2018 | Liaw | |
| 2018/0204932 A1 * | 7/2018 | Mehandru | H01L 21/8221 |
| 2019/0279712 A1 * | 9/2019 | Siau | G11C 7/18 |

FOREIGN PATENT DOCUMENTS

| | | |
|---|---|---|
| KR | 20160032049 A | 3/2016 |
| KR | 20160040577 A | 4/2016 |
| TW | 201032324 A | 9/2010 |
| TW | 2014038177 | 9/2010 |
| TW | 201539724 A | 10/2015 |

\* cited by examiner

METHOD OF FABRICATING A MEMORY DEVICE HAVING MULTIPLE METAL INTERCONNECT LINES

PRIORITY DATA

The present application is a divisional application of U.S. application Ser. No. 16/048,262, filed Jul. 28, 2018, now U.S. Pat. No. 10,522,462, which is a divisional of U.S. application Ser. No. 15/353,618 filed Nov. 16, 2016, now U.S. Pat. No. 10,074,605, entitled "MEMORY CELL AND ARRAY STRUCTURE HAVING A PLURALITY OF BIT LINES," which claims priority from Provisional Application Ser. No. 62/356,764 filed on Jun. 30, 2016, entitled "MEMORY ARRAY STRUCTURE AND METHODS OF FABRICATING THEREOF", both are hereby incorporated by reference in their entirety.

BACKGROUND

The present application relates generally to the field of semiconductor devices, and more particularly, to integrated circuits and methods for forming the integrated circuits.

Memory circuits have been used in various applications. Conventionally, memory circuits can include DRAM, SRAM, or non-volatile memory circuits such as ROM. The memory circuits typically include a plurality of memory cells arranged in arrays. The memory cells are typically accessed through a bit line (BL) (associated with a column of the array) and a word line (WL) (associated with a row of the array). The memory cell at the intersection of the specified BL and WL is the addressed cell. An exemplary SRAM memory cell is a 6-transistor (6-T) static memory cell. The 6-T SRAM memory cell is coupled with other cells in the array and peripheral circuitry using a bit line (BL), a complement bit line (bit line bar) (BLB), and a word line (WL). Four of the six transistors form two cross-coupled inverters for storing a datum representing "0" or "1". The remaining two transistors serve as access transistors to control the access of the datum stored within the memory cell. Various other memory cell designs are also used in a variety of applications.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
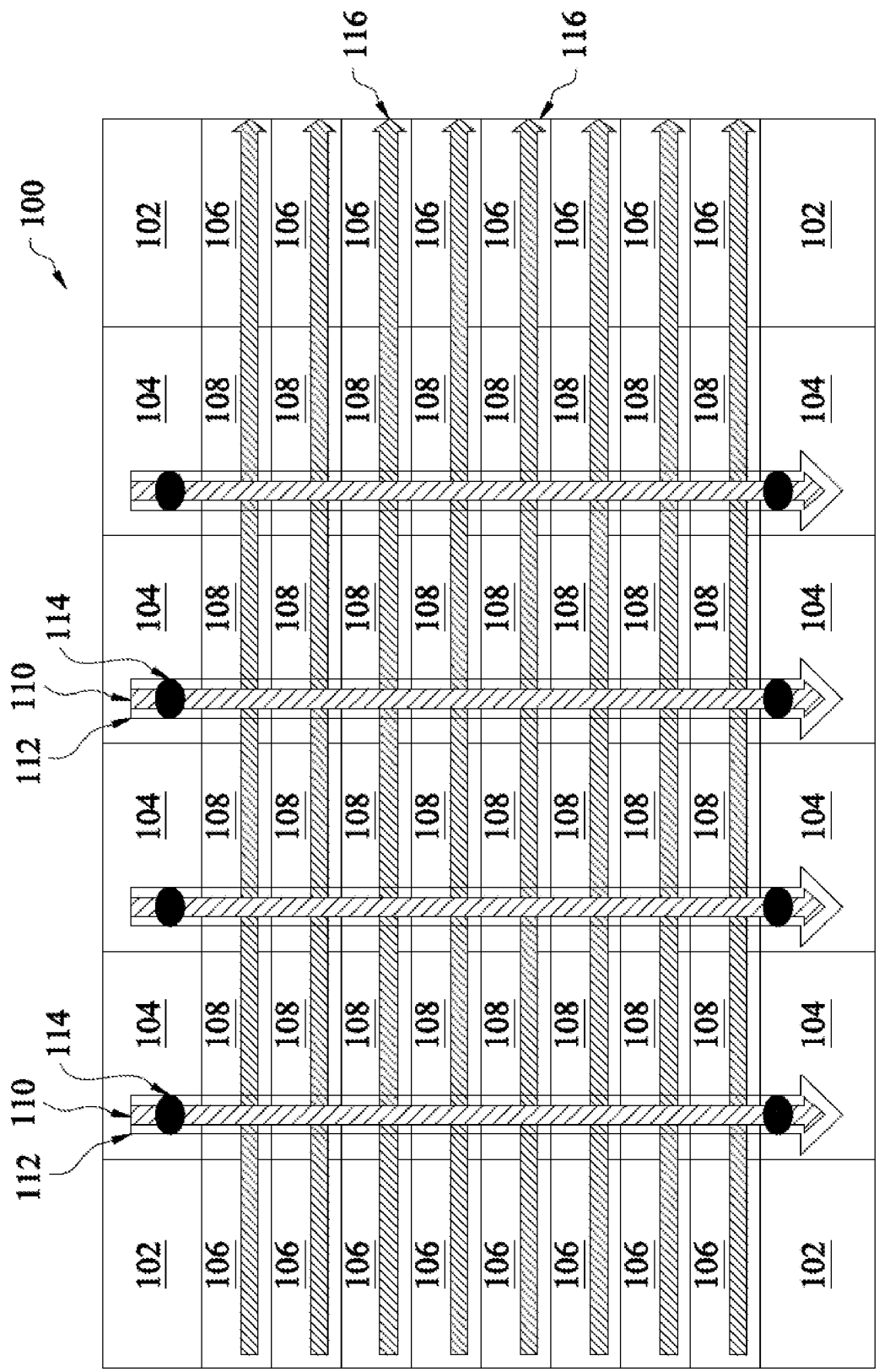
FIG. 1 illustrates a top view of a layout of an array of semiconductor memory cells according an embodiment of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 20:
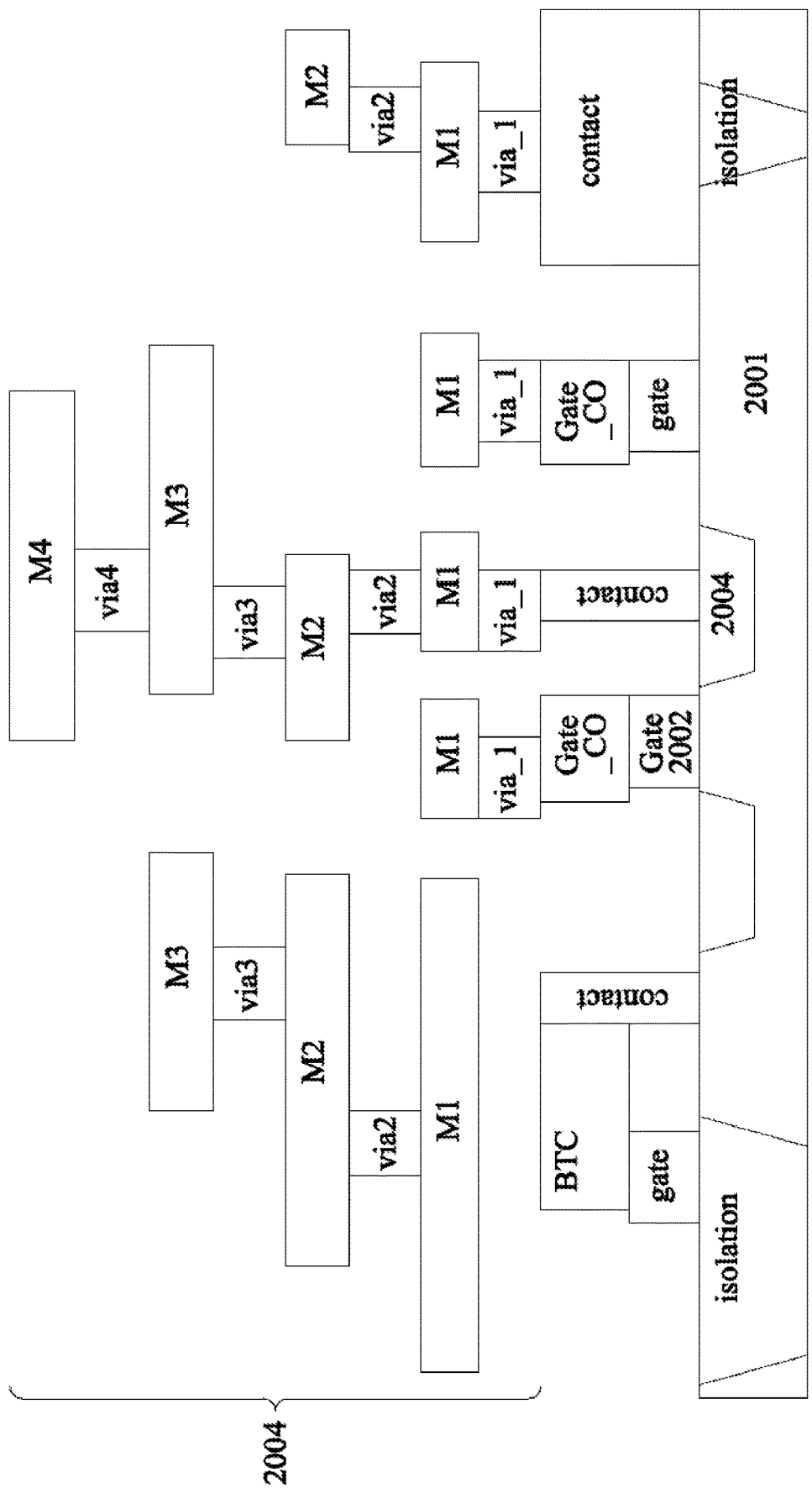
FIG. 20 illustrates a cross-sectional view of an exemplary metal stack disposed on a substrate provided for example in a memory device constructed according to various aspects of the present disclosure.

While certain embodiments are provided herein that describe providing an interconnect architecture using a given metal layer (e.g., Metal-1 (M1), Metal-2 (M2), Metal-3 (M3)) of a multi-layer interconnect (MLI), one of ordinary skill in the art would appreciate that other metal layers may be used to implement the interconnect architecture of the present disclosure. For example, the embodiments discussed herein may be implemented using a multi-layer interconnect (MLI) such as illustrated in FIG. 20 including, for example, via 1, Metal-1 (M1), via 2, Metal-2 (M2), via 3, Metal-3 (M3), via 4, and Metal-4 (M4). The MLI includes densely layered structure of conductive lines (e.g., extending a length in a direction parallel a top surface of the substrate), interconnecting vertically extending conductive vias, and interposing insulating films that provide electrical interconnection (and associated insulating) to and among various devices on a substrate. While in some embodiments three or four metal layers are shown, any number of metal layers may be provided and used to implement the present disclosure. A MLI structure may also be referred to as back-end metallization having numerous stacked metal layers, extending in a horizontal direction, and vertically extending vias or contacts, that provide connection between and to the stacked metal layers. The MLI may be disposed over the substrate and above the contact level (e.g., above the gate contact, source/drain contact, etc) see FIG. 20.

Generally, relative terms such as "first metal layer" and "second metal layer" are used for ease of identification and do not necessitate that the feature be formed on any specific metal layer, e.g., M1 and M2, respectively unless specifically noted. The present disclosure describes a metal layer as the next adjacent metal layer for two metal layers in a stack that are interposed by dielectric and/or a via, but without another metal layer providing a routing in a substantially horizontal direction—for example, M2 is the next adjacent metal layer to M1, each of M5 and M3 are the next adjacent metal layer to M4, and so forth.

Referring to FIG. 1, illustrated is a memory device 100 including a plurality of cells 102, 104, 106, 108 arranged in an array. The memory device 100 of FIG. 1 may be a ROM device, a DRAM device, and/or other suitable memory device technology. The cells 102 may be corner dummy cell(s). The cells 104 may be an edge cell. The cells 106 may be edge cells. Certain of the cells 102, 104, 106 may not be used to store data, however, provide other functionality to the device, for example, the cells 104 may provide a well contact and/or strap functionality (see, e.g., U.S. Pat. No. 7,812,407, which is incorporated herein by reference). The memory cells 108 may be functional storage memory cells of the array, each memory cell 108 capable of storing a piece of data (e.g., stored bit). For example, each of the memory cells 108 is capable of being an addressed memory cell, accessed by turning "on" the associated WL/BL connecting to the memory cell 108.

It is noted that the memory device 100 is illustrative of a memory array having 4 columns by 8 rows of memory cells 108 providing storage. This array configuration and size is exemplary only for illustrative purposes and not intended to be limiting to any array size or configuration.

The memory device 100 may be disposed on a semiconductor substrate. In an embodiment, the semiconductor substrate includes silicon. Other example compositions include, but are not limited to, silicon germanium, silicon carbide, gallium arsenide, indium arsenide, indium phosphide, silicon germanium carbide, gallium arsenic phosphide, gallium indium phosphide, germanium, and/or other suitable materials. The memory cells 108 formed on the semiconductor substrate may be any suitable memory cell design, including, for example, those defined with reference to FIGS. 17, 18, and/or 19, discussed below.

A bit line (BL) 110 is provided for (also referred to as associated with) each column of the memory device 100. A word line (WL) 116 is provided for (also referred to as associated with) each row of the array of the memory device 100. The BL/WL is an interconnect line associated with a respective column/row of the array as it is a line that carries a signal (e.g., voltage) that is used to read/write from an addressed cell of that column/row. The intersection of the specified row-column pair defined by the respective BL/WL that is turned "on" is referred to as the addressed element or addressed memory cell 108.

In addition to the single BL 110 and single WL 116, the memory device 100 illustrates a dual line configuration for bit lines of the device 100. The memory device 100 includes the first bit line ($1^{st}$ BL) 110, as discussed above, and additionally also includes a second bit line ($2^{nd}$ BL) 112 associated with each column of the array of memory devices 108. The $1^{st}$ BL 110 is coupled to every addressable memory cell (bit) 108 in the given column and serves to access the addressed cell. For example, the $1^{st}$ BL 110 may be coupled to an element of the memory cell 108 such as the source/drain of the transistor (see, e.g., FIGS. 18, 19). The memory device 100 also includes the $2^{nd}$ BL 112 that is associated with the same column as one $1^{st}$ BL 110. In some embodiments, the $2^{nd}$ BL 112 runs parallel to the $1^{st}$ BL 110 on another (e.g., higher) metal layer disposed over the memory cells 108. The $2^{nd}$ BL 112 associated with the column is coupled to the $1^{st}$ BL 110 for the given column at one or more locations. In the embodiment illustrated in FIG. 1, the $2^{nd}$ BL 112 is coupled to the $1^{st}$ BL 110 at two locations—illustrated as vias 114. While the vias 114 are illustrated over the associated edge cell 104, in other embodiments, the interconnection between the $1^{st}$ BL 110 and the $2^{nd}$ BL 112 may be configured over other portions of the device 100. In some embodiments, the $2^{nd}$ bit line 112 for a given column is coupled to the $1^{st}$ BL 110 for that column at more than two locations including within the array of memory cells 108 (e.g., at the periphery of one of the addressable memory cells 108).

The $2^{nd}$ BL line 112 may be coupled to the memory cell element 108 (e.g., including its transistor) through its connection with the $1^{st}$ BL 110. In other words, an electrical path between the $2^{nd}$ BL line 112 and an addressed memory cell 108 is through the BL line 110. For example, the circuitry of the cell 108 may drive the $1^{st}$ BL 110 through a connection (e.g., a via/contact connection) of the $1^{st}$ BL to the transistor/capacitor/etc of the addressed memory cell 108. The $2^{nd}$ BL 112 associated with the column is coupled to the $1^{st}$ BL 110 and thus, is provided at the same state. For example, in an embodiment of a read accesses of some memory device 100 (e.g., DRAM), the $1^{st}$ BL 110 is connected to storage capacitors of the memory cell 108 and charge sharing causes the $1^{st}$ BL 110 to swing upwards or downwards. The $2^{nd}$ BL 112 receives this state through connection with the $1^{st}$ BL 110. One of the $1^{st}$ BL 110 and the $2^{nd}$ BL 112 extends to peripheral circuitry to provide the state of the addressed cell. Thus, the state of the $1^{st}$ BL 110 and the $2^{nd}$ BL 112 are tied together (i.e., the same) and can be determined by the memory device 100 by the coupling of one of the $1^{st}$ BL 110 and the $2^{nd}$ BL 112 to the memory cell 108 and one of the $1^{st}$ BL 110 and the $2^{nd}$ BL 112 to the peripheral control circuitry.

In some embodiments, only one of the $1^{st}$ BL 110 and the $2^{nd}$ BL 112 are connected to peripheral control circuitry (not shown) of the memory device 100. For example, one of the $1^{st}$ BL 110 and the $2^{nd}$ BL 112 may extend to circuitry such as column address circuitry, decoders, sense amplifiers, drivers, precharge circuitry, Vdd, and/or other suitable peripheral circuitry functionality. In a further embodiment, the other one of the $1^{st}$ BL 110 and the $2^{nd}$ BL 112 terminates without a physical connection to the control circuitry. For example, in an embodiment, the $2^{nd}$ BL 112, while extending beyond in the interconnection point with $1^{st}$ BL 110 (via 114), terminates at a point prior to connection with the control circuitry of the memory device 100, while the $1^{st}$ BL 110 extends to the peripheral circuitry. In another embodiment, the $2^{nd}$ BL 112 extends to the peripheral circuitry and the $1^{st}$ BL 110 terminates at a point prior to connection with the control circuitry for the array after interconnection (e.g., via 114) with the $2^{nd}$ BL 112. Thus, it is reiterated that the state of the $1^{st}$ BL 110 and the $2^{nd}$ BL 112 are tied together and this state be determined by the coupling of one of the $1^{st}$ BL 110 and the $2^{nd}$ BL 112 to the peripheral circuitry. For example, in some embodiments, the $1^{st}$ BL 110 is coupled to a peripheral device (e.g., sense amplifier), and the $2^{nd}$ BL 112 is coupled to the peripheral device (e.g., sense amplifier) only through the $1^{st}$ BL 110.

The $1^{st}$ BL 110 and the $2^{nd}$ BL 112 are horizontally extending conductive lines referred to as metal layers (e.g., M1, M2, etc above the substrate) of an MLI. The metal layers that form the $1^{st}$ BL 110 and/or the $2^{nd}$ BL 112 are conductive materials including, for example, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials. In an example, a damascene and/or dual damascene process is used to form the metal layers. The $1^{st}$ BL 110 and the $2^{nd}$ BL 112 are coupled by via 114. The via 114 may include copper, tungsten, and/or other suitable conductive materials. Excluding one or more vias 114, the $1^{st}$ BL 110 and the $2^{nd}$ BL 112 may be insulated from one another by suitable dielectric material of the MLI structure such as, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. It is noted that the differing widths of the BL 110 and 112 in the illustration of FIG. 1 (as with the other Figures provided herein) are for ease of illustration and not intended to be limiting to any relative width.

Similarly, the WL 116 may be conductive materials including, for example, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials.

In an embodiment, the $1^{st}$ BL 110 is positioned on metal layer Mn and the $2^{nd}$ BL 112 positioned on metal layer Mn+x, where x is equal to 1 or more. In an embodiment, n is equal to 1 (e.g., $1^{st}$ BL 110 is disposed on Metal-1 (M1)) and x is equal to 1, thereby defining the next adjacent metal layer (e.g., $2^{nd}$ BL 112 is disposed on Metal-2 (M2)). In such an embodiment, the via 114 interconnecting $1^{st}$ BL 110 and the $2^{nd}$ BL 112 is via interposing and interfacing with each of adjacent metal layers—e.g., Metal 1 and Metal 2 typically referred to as via 2 of the MLI. In an embodiment, the WL 116 may be located at the next adjacent metal layer above the $2^{nd}$ BL 112, e.g., Metal-3 (M3). In another embodiment, n is equal to 1 (e.g., $1^{st}$ BL 110 is disposed on Metal-1 (M1)) and x is equal to 2 (e.g., $2^{nd}$ BL 112 is disposed on Metal-3 (M3)). In such an embodiment, the via 114 interconnecting $1^{st}$ BL 110 and the $2^{nd}$ BL 112 includes vias of multiple layers and/or landing pads interposing Metal 1 (M1) and Metal 3 (M3), as further discussed with reference to FIG. 7. In a further embodiment, the WL 116 is located at Metal 2, the next adjacent metal layer to that of the $1^{st}$ BL 110. In other embodiments, each of $1^{st}$ BL 110, $2^{nd}$ BL 112, and WL 116 are located on various different metal lines.

The use of the dual bit line structure and the $1^{st}$ BL 110 and the $2^{nd}$ BL 112 for each column of the array of memory device 100 may provide an advantage of reducing the resistance of addressing the memory element 108. The lower bit line resistance may allow for less bit line IR drop during addressing the memory cell 108 (e.g., during a write cycle) thereby improving the quality of the memory device 100 (e.g., improving the write margin). In other words, there may be a reduction in error(s) caused by a voltage drop across the resistance of a source path to the device's ground when current flows. In some embodiments, the lower bit line resistance allows for a reduction in the bit line resistive-capacitive (RC) delay.

Providing an additional metal line as a second bit line for each column may have an advantage over, for example, reducing the width of a single metal line forming a single bit line in a memory device. In reducing the width, the thickness may need to be reduced in order to avoid an aspect ratio that is not reliability formed using fabrication techniques (e.g., damascene processes).

Figure 2:
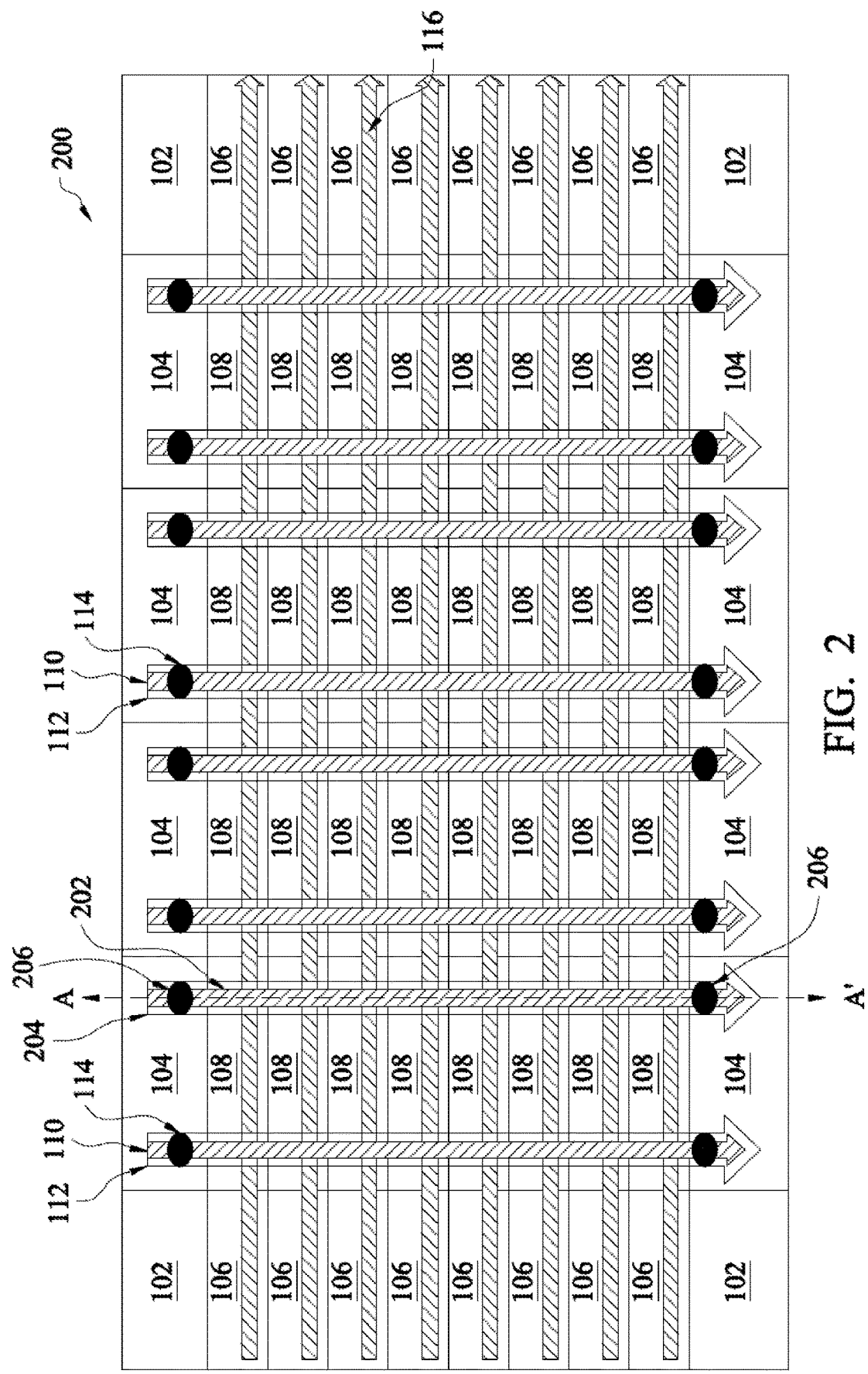
FIG. 2 illustrates a top view of a layout of an array of semiconductor memory cells according an embodiment of the present disclosure.

Referring to FIG. 2, illustrated is an embodiment of a memory device 200. In an embodiment, the memory device 200 is a static random access memory (SRAM) device. FIG. 2 is illustrative of a memory array having 4 columns by 8 rows of memory cells 108. Again, this array configuration and size is exemplary only for illustrative purposes and not intended to be limiting to any array size or configuration. The memory device 200 may be substantially similar to the memory device 100, discussed above with reference to FIG. 1, except that the memory device 200 includes a complementary bit line (also referred to as bit line bar or BL_bar) associated with each column of the array of memory cells 108. The memory device 200 includes the $1^{st}$ BL 110 and the $2^{nd}$ BL 112 for each column of the memory cells 108, substantially similar to as discussed above with reference to FIG. 1. Additionally, the memory device 200 also includes a first complementary bit line ($1^{st}$ BL_bar) 202 and a second complementary bit line ($2^{nd}$ BL_bar) 204 for each column of the memory cells 108. The $1^{st}$ BL_bar 202 is a complementary bit line to the $1^{st}$ BL 110. The $2^{nd}$ BL_bar 204 is coupled to the $2^{nd}$ BL_bar 202, substantially similar to as discussed above with reference to the $2^{nd}$ BL 114 with respect to the $1^{st}$ BL 110. A via 206 provides the interconnection between the $2^{nd}$ BL_bar 204 is coupled to the $2^{nd}$ BL_bar 202. The via 206 is substantially similar to the via 114 discussed above.

As discussed above, the $1^{st}$ BL 110 is connected to every addressable memory cell 108 in the given column; similarly, the $1^{st}$ BL_bar 202 is also connected to every memory cell 108 in the given column. For example, the $2^{nd}$ BL line 112 may be connected to the memory cell element 108 (e.g., including its transistor) only through connection with the $1^{st}$ BL 110. In other words, an electrical path between the $2^{nd}$ BL line 112 and the given addressed memory cell 108 is through the $1^{st}$ BL line 110. The device 200 also includes complementary bit line (BL_bar) as suitable for certain types of memory devices (e.g., SRAM). The $2^{nd}$ BL_bar line 204 may be connected to the memory cell element 108 (e.g., including its transistor) only through connection with the $1^{st}$ BL_bar 202. In other words, an electrical path between the $2^{nd}$ BL_bar 204 and the given addressed memory cell 108 is through the $1^{st}$ BL_bar 202. The $1^{st}$ BL_bar and the $2^{nd}$ BL_bar may be coupled to the memory cell 108 substantially similar to as illustrated with respect to FIG. 17.

As illustrated in the device 200, the $2^{nd}$ BL 112 associated with the column is coupled to the $1^{st}$ BL 110 for the given column at two locations—illustrated as vias 114. In other embodiments, the $2^{nd}$ BL 112 is coupled to the $1^{st}$ BL 110 at one location or more locations for a given column where the coupling may be provided at one or more of various locations including over an edge cell 104, over the array of memory cells 108 (e.g., at a peripheral edge of one or more addressable cells 108). As illustrated in the device 200, the $2^{nd}$ BL_bar 204 associated with the column is coupled to the $1^{st}$ BL_bar 202 for the given column at two locations—vias 206. In other embodiments, the $2^{nd}$ BL_bar 204 is coupled to the $1^{st}$ BL_bar 202 at one location or at additional locations for a given column where the coupling may be provided at one or more of various locations including over an edge cell 104, over the array of memory cells 108 (e.g., at a peripheral edge of one or more addressable cells 108).

In an embodiment, the vias 114 indicate one or more vias or landing pads extending from the $2^{nd}$ BL 112 to the $1^{st}$ BL 110, where the $1^{st}$ BL 110 is positioned on metal layer Mp and the $2^{nd}$ BL 112 is positioned on metal layer Mp+y, where y is equal to 1 or more. In an embodiment, the vias 206 indicate one or more vias or landing pads extending from the 2nd BL_bar 204 to the $1^{st}$ BL_bar 202, where the 1st BL_bar 202 is positioned on metal layer Mp and the $2^{nd}$ BL_bar 204 is positioned on metal layer Mp+y, where y is equal to 1 or more. While not required, typically the $1^{st}$ BL and $1^{st}$ BL_bar are disposed on the same metal layer (e.g., "p").

In an embodiment, p is equal to 1 (e.g., $1^{st}$ BL 110 and/or BL_bar 202 is disposed on Metal-1 (M1)) and y is equal to 1 (e.g., $2^{nd}$ BL 112 and/or BL_bar 204 are disposed on the next adjacent, overlying metal layer, Metal-2 (M2)). In such an embodiment, via 206 interconnecting $1^{st}$ BL_bar and the $2^{nd}$ BL_bar is via interposing Metal 1 and Metal 2, e.g., via 2 of the MLI which interfaces and connects M1 and M2. In a further embodiment, the WL 116 may be located at Metal 3 (M3).

In another embodiment, p is equal to 1 (e.g., $1^{st}$ BL 110 and/or $1^{st}$ BL_bar 202 is disposed on Metal-1) and y is equal to 2 (e.g., $2^{nd}$ BL 112 and/or $2^{nd}$ BL_bar 204 is disposed on Metal-3). In such an embodiment, the via 206 interconnecting $1^{st}$ BL_bar 202 and the $2^{nd}$ BL_bar 206 includes vias and/or landing pads interposing Metal 1 and overlying, non-adjacent Metal 3 (e.g., via 2, via 3, landing pad at M2). In a further embodiment, the WL 116 is located at Metal 2 (e.g., interposing $1^{st}$ BL_bar 202 and $2^{nd}$ BL_bar 204.) In some embodiments, each of $1^{st}$ BL_bar 202, $2^{nd}$ BL_bar 204, and WL 116 are located on different metal lines of a various configuration. Exemplary embodiments of this are illustrated in FIGS. 3-10B that follow, which apply also to the device 200 of FIG. 2.

As discussed above with reference to the device 100, and as also applies to the device 200, in some embodiments, only one of the $1^{st}$ BL 110 and the $2^{nd}$ BL 112 are connected to peripheral control circuitry (not shown) of the memory device 100. Similarly, only one of the $1^{st}$ BL_bar 202 and the $2^{nd}$ BL_bar 204 may be connected to the peripheral control circuitry. For example, one set of the $1^{st}$ BL 110/1' BL_bar 202 or the $2^{nd}$ BL 112/$2^{nd}$ BL_bar 204 may extend to circuitry such as column address circuitry, decoders, sense amplifiers, drivers, precharge circuitry, Vdd, and/or other peripheral circuitry functionality. In a further embodiment, the other set of the $1^{st}$ BL 110/1' BL_bar 202 or the $2^{nd}$ BL 112/$2^{nd}$ BL_bar 204 terminates without a physical connection to the control circuitry. For example, in an embodiment, the $2^{nd}$ BL_bar 204, while extending beyond in the interconnection point (via 116) with $1^{st}$ BL_bar 202, terminates at a point prior to connection with the control circuitry for the array, while the $1^{st}$ BL_bar 202 extends to the peripheral circuitry. In another embodiment, the $2^{nd}$ BL_bar 204 extends to the peripheral circuitry and the $1^{st}$ BL_bar 202 terminates at a point prior to connection with the control circuitry for the array after interconnection (e.g., via 206) with the $2^{nd}$ BL_bar 204. Again as the state of the $1^{st}$ BL_bar 202 and the $2^{nd}$ BL_bar 204 are tied together (i.e., the same) and can be determined by the coupling of one of the $1^{st}$ BL_bar 202 and the $2^{nd}$ BL_bar 204 to the peripheral circuitry.

Similar to the double bit lines of $1^{st}$ BL 110 and $2^{nd}$ BL 112, the double complementary bit lines of $1^{st}$ BL_bar 202 and the $2^{nd}$ BL_bar 204 are conductive lines referred to as metal layers (e.g., M1, M2, etc above the substrate) of an MLI. The metal layers that form the $1^{st}$ BL_bar 202 and the $2^{nd}$ BL_bar 204 are conductive materials including, for example, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials. In an example, a damascene and/or dual damascene process is used to form the metal layers. The via 206 may include copper, tungsten, and/or other suitable conductive materials. Excluding the via 206, the $1^{st}$ BL_bar 202 and the $2^{nd}$ BL_bar 204 may be insulated from one another by suitable dielectric material such as, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 3:
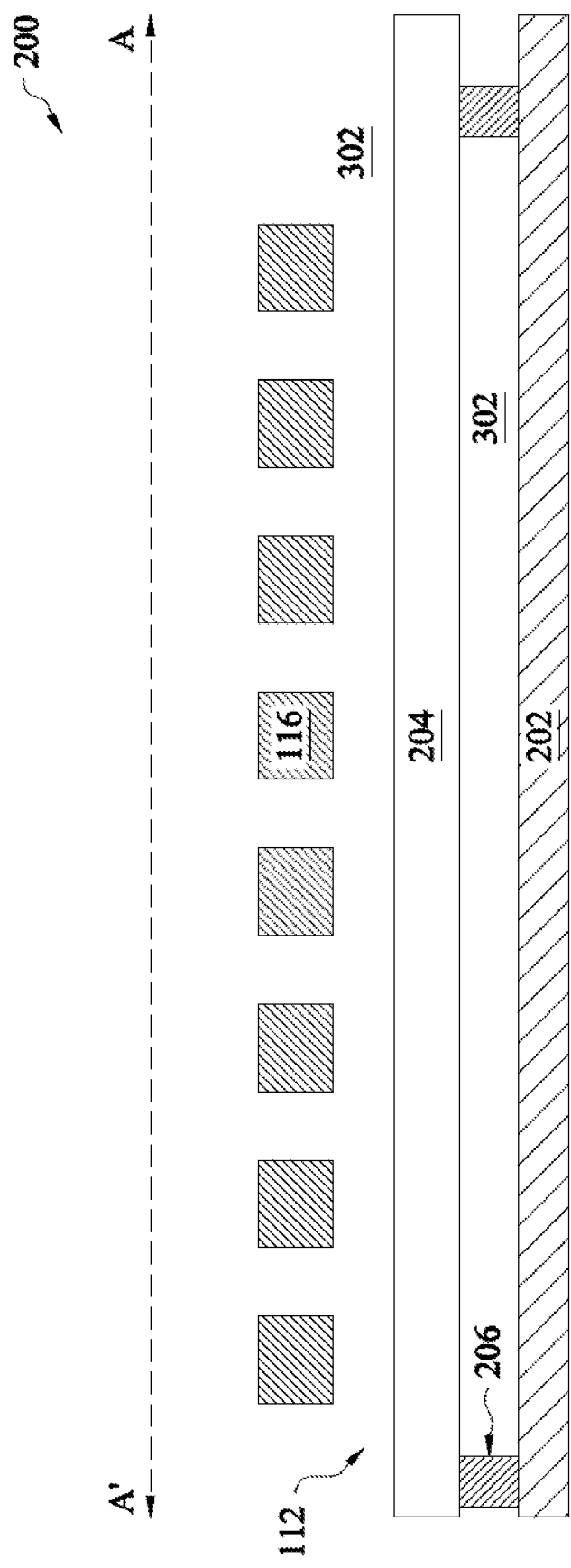
FIG. 3 illustrates an exemplary cross-sectional view according to embodiments of FIGS. 1 and 2.

FIG. 3 illustrates an embodiment of a cross-sectional representation of the cut A-A' of the device 200 of FIG. 2. FIG. 3 is illustrative of an embodiment of a cross-sectional view through the BL_bar region. However, a substantially similar cross-sectional view may also be representative of a parallel cut through a BL of the device 200. FIG. 3 illustrates a plurality of metal layers and vias that are part of a MLI disposed on substrate, which are interposed by an inter-layer dielectric (ILD) layer(s) 302. By way of example, the ILD layer 302 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 302 may be deposited by a subatmospheric CVD (SACVD) process, a flowable CVD process, or other suitable deposition technique.

FIG. 3 illustrates $1^{st}$ BL_bar 202 formed on a first metal layer (e.g., M1), the $2^{nd}$ BL_bar 204 formed on a second, higher, metal layer (e.g., M2), and the word line (WL) 116 formed on a third adjacent, higher metal layer (e.g., M3). The via 206 connects the $1^{st}$ BL_bar 202 and the $2^{nd}$ BL_bar 204. The $1^{st}$ BL_bar 202 is coupled to an element disposed on the substrate (e.g., contact to a transistor region) through, for example, a via (not shown) extending from and below the first metal layer.

Figure 4A:
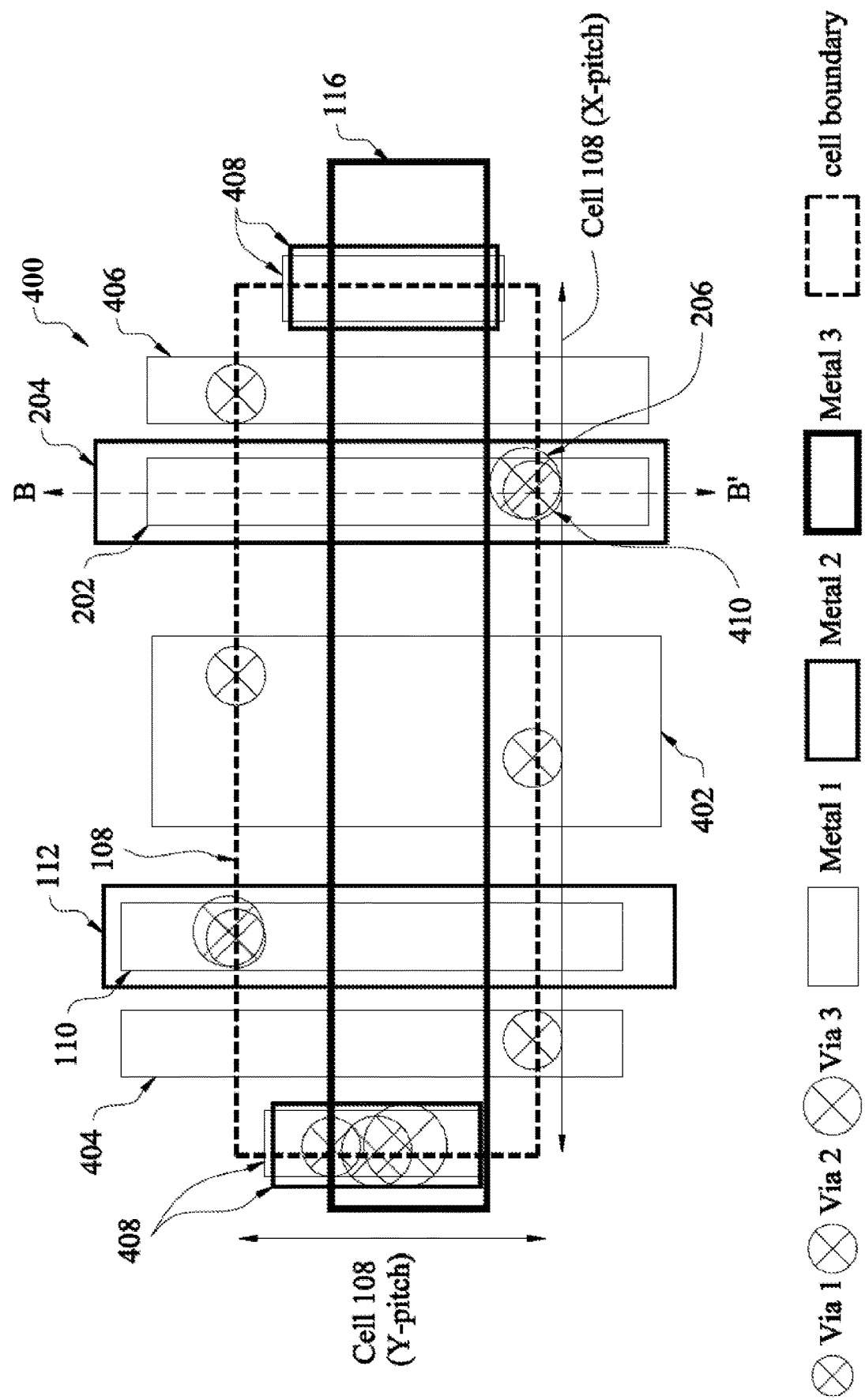
FIGS. 4A and 4B illustrate a layout view and a cross-sectional view according to various aspects of the present disclosure in an embodiment of the device of FIG. 2.
Figure 4B:
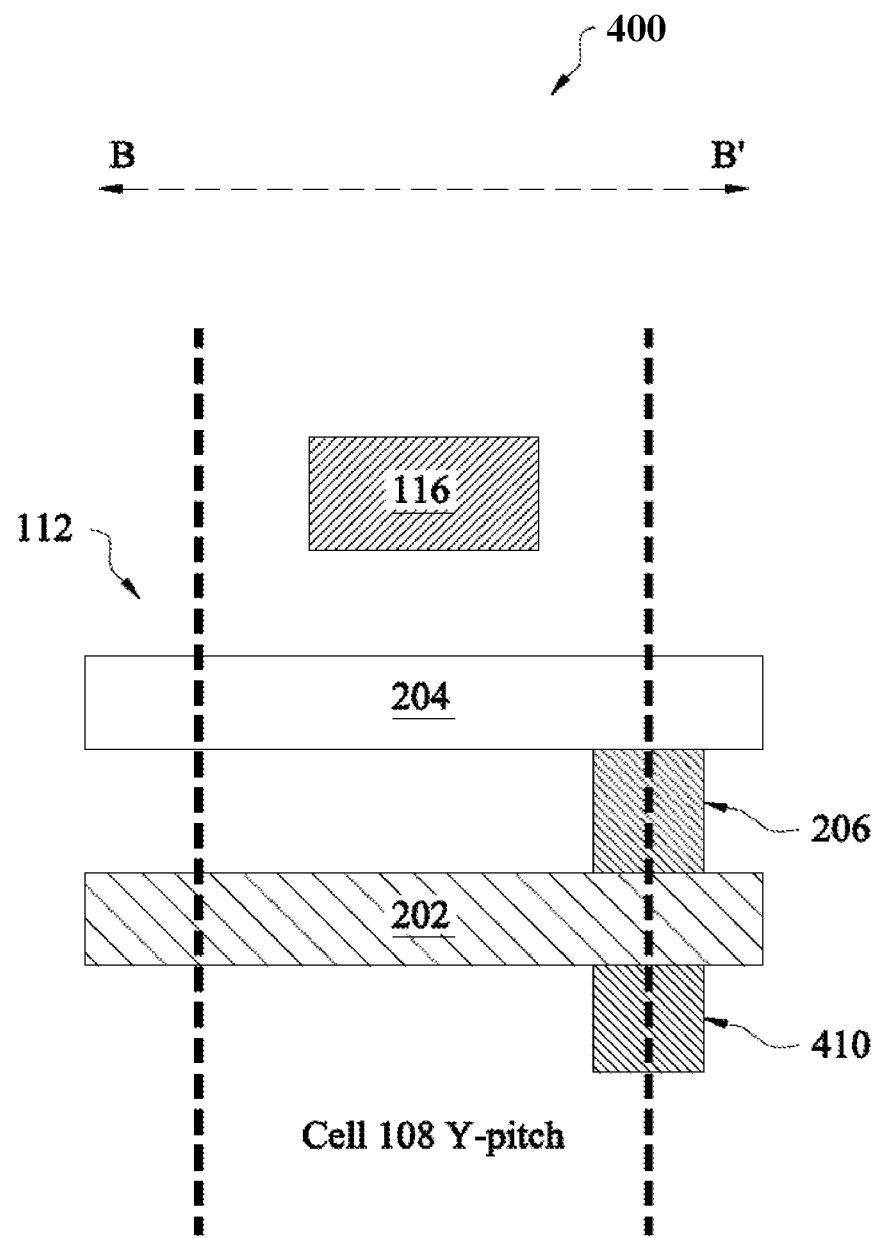

FIGS. 4A and 4B illustrate a layout view and a cross-sectional view respectively of a portion 400 of a memory device. In an embodiment, the portion 400 is an embodiment of the memory cell 108 of the memory device 200, described above with reference to FIGS. 2 and 3. The portion 400 may include the memory cell 108 as an SRAM memory cell. The layout portion 400 includes the $1^{st}$ BL 110, the $2^{nd}$ BL 112, the $1^{st}$ BL_bar 202, the $2^{nd}$ BL_bar 204 and the WL 116. The layout portion 400 further includes Vdd-lines 403, Vss lines 404, and Vss lines 406. The layout portion 400 includes word-line landing pads (Metal 1, Metal 2) 408.

In the illustrated embodiment, the $1^{st}$ BL 110, the $1^{st}$ BL_bar 202, the $1^{st}$ Vdd line 402, the Vss lines 404 are each formed on a first metal layer (e.g., M1). The $2^{nd}$ BL 112 and the $2^{nd}$ BL_bar 204 are formed on a second metal layer (e.g., M2) above the first metal layer. The WL 116 is disposed on a third metal layer (e.g., M3) above the second metal layer. The Vss lines 406 may be disposed on the first and second metal layers (e.g., M1 and M2). A plurality of vias are illustrated (circle encasing an "x") to show interconnection between the features. Via 410 illustrates an interconnection between 1$^{st}$ BL_bar 202 and an underlying element of the memory cell 108; via 206 provides an interconnection between 1$^{st}$ BL_bar 202 and the overlying 2$^{nd}$ BL_bar 204. In an embodiment, the via 410 connects the 1$^{st}$ BL_bar with the source/drain of a transistor of the memory cell 108 (e.g., a drain node of a pass-gate device in the cell 108 as an SRAM device, see, e.g., FIG. 17).

FIG. 4B illustrates a corresponding cross-sectional view along cut B-B' of the layout portion 400 of FIG. 4A including the 1$^{st}$ BL_bar 202, the 2$^{nd}$ BL_bar 204, and the WL 116 on successive metal layers with via 206 interconnecting the 1$^{st}$ BL_bar 202 and the 2$^{nd}$ BL_bar 204 and via 410 providing a connection to the underlying element of the memory cell 108 (e.g., transistor).

Figure 5:
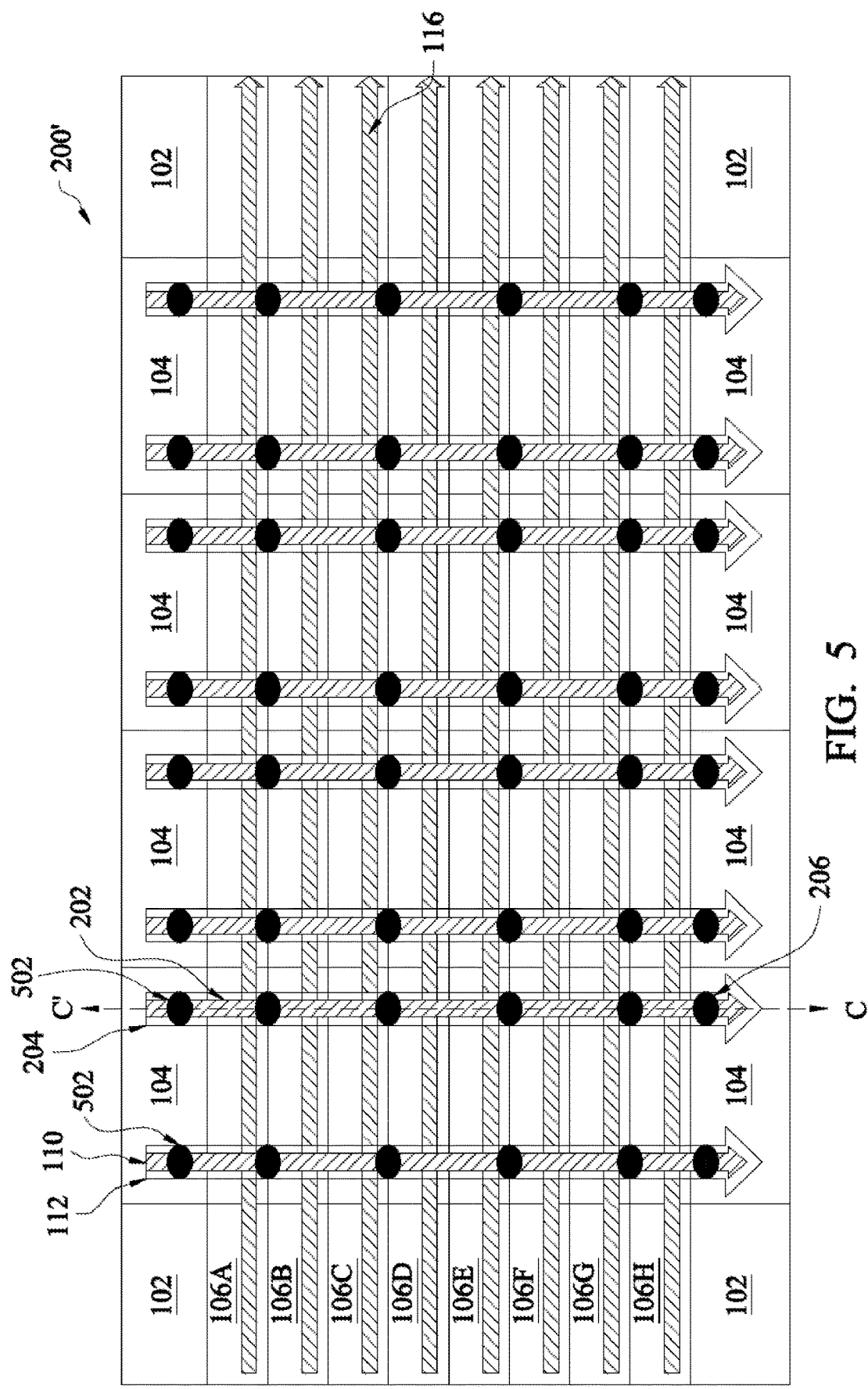
FIG. 5 illustrates a top view of a layout of an array of semiconductor memory cells according an embodiment of the present disclosure.

FIG. 5 illustrates another embodiment of the memory device 200, denoted memory device 200'. In an embodiment, the device 200' is an SRAM device. The device 200' is substantially similar to the device 200, described above with reference to FIGS. 2, 3, 4A, and 4B. Additionally, the device 200' illustrates an additional plurality of connections (coupling) between the 1$^{st}$ BL 110 and the 2$^{nd}$ BL 112 and an additional plurality of connections (coupling) between the 1$^{st}$ BL_bar 202 and the 2$^{nd}$ BL_bar 204. The six (6) interconnections 502 are exemplary only and not intended to be limited in number or position. In an embodiment, one or more of the plurality of interconnections 502 are disposed over the cells 104 that provide the well or strap region. These interconnections 502 may be substantially similar to the interconnections 206 and 114 described above. In an embodiment, one or more of the plurality of interconnections is disposed at a cell boundary or peripheral region of the memory cell 108. The interconnections 502 include one or more vias or conductive landing pads extending from between the dual bit lines/dual complementary bit lines.

As described above, the 1$^{st}$ BL 110 is coupled to every cell 108 in the associated column. The 2$^{nd}$ BL 112 is coupled to 1$^{st}$ BL a plurality of times in the associated column, by way of the interconnections 502. 1$^{st}$ BL_bar 202 is coupled to every addressable cell 108 in the associated column (e.g., through via/contact interconnection with transistor element), and 2$^{nd}$ BL_bar 204 coupled to 1$^{st}$ BL_bar a plurality of times for the associated column by way of the interconnections 502. It is noted that the embodiment of FIG. 1 illustrating the device 100 may also include the plurality of interconnects illustrated as 502; in other words, in some embodiments a plurality of interconnects (vias) between the 1$^{st}$ BL and the 2$^{nd}$ BL in a given column including those interconnections 502 within the array may be used in other types of memory arrays, including those that do not include a complementary bit line.

In some embodiments, the interconnections 502 are each a via (see, e.g., FIG. 6) extending from one metal layer to an underlying metal layer. In some embodiments, the interconnections 502 include a plurality of vias and/or landing pads in order to provide a connection between a metal layer and a non-adjacent, underlying metal layer. The interconnections 502 may include a suitable conductive material such as, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials.

Figure 6:
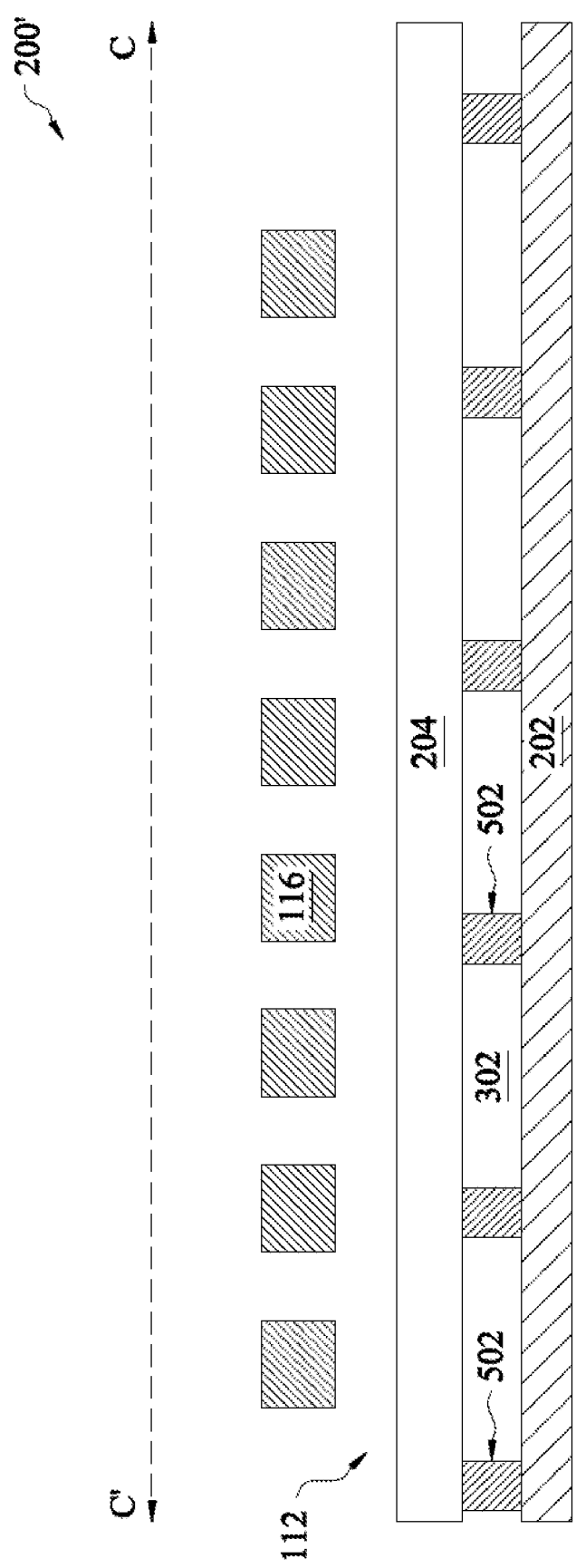
FIG. 6 illustrates an exemplary cross-sectional view according to embodiments of FIG. 5.

FIG. 6 illustrates a cross-sectional view an embodiment of the device 200' along the C-C' cut line of FIG. 5. FIG. 6 illustrates an embodiment of the device 200' having the 1$^{st}$ BL_bar 202 on a first metal layer (e.g., M1), the 2$^{nd}$ BL_bar 204 on a second, overlying, metal layer (e.g., M2), and the WL 116 on a third, overlying, metal layer (e.g., M3). It is noted in this embodiment, that the second metal layer (including 2$^{nd}$ BL_bar 204) is the next adjacent overlying metal layer to the first metal layer (including 1$^{st}$ BL_bar 202).

Figure 7:
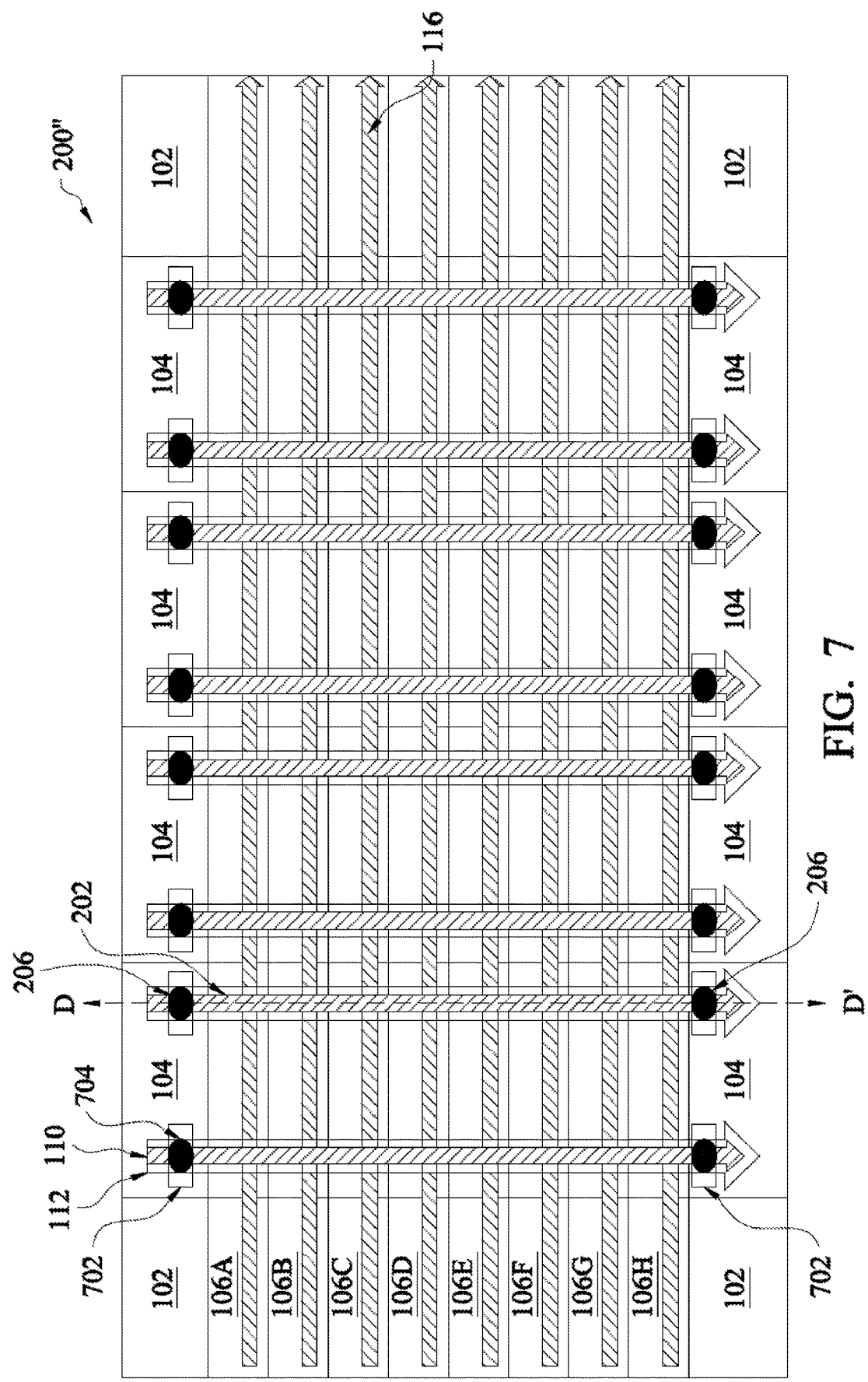
FIG. 7 illustrates a top view of another layout of an array of semiconductor memory cells according an embodiment of the present disclosure.

FIG. 7 illustrates another embodiment of a memory device denoted memory device 200". In an embodiment, the device 200" is an SRAM device. The device 200" is substantially similar to the device 200, described above with reference to FIGS. 2, 3, 4A, and 4B. The memory device 200" is illustrative of a further embodiment of the memory device where the 1$^{st}$ BL 110 and the 2$^{nd}$ BL 112 are not disposed on adjacent metal layers and thus, a landing pad 702 in conjunction with vias 704 provide a vertical interconnection between the 1$^{st}$ BL 110 and the 2$^{nd}$ BL 112. Similarly, the memory device 200" is illustrative of an embodiment of the device 200 where the 1$^{st}$ BL_bar 202 and the 2$^{nd}$ BL_bar 204 are not disposed on adjacent metal layers and thus, landing pads 702 in conjunction with vias 704 provide vertical interconnection between the 1$^{st}$ BL_bar 202 and the 2$^{nd}$ BL_bar 204.

As described above, the 1$^{st}$ BL 110 is coupled to every cell 108 in the associated column. The 2$^{nd}$ BL 112 is coupled to 1$^{st}$ BL one or more times in the associated column by way of the interconnections 702 and 704. 1$^{st}$ BL_bar 202 is coupled to every addressable cell 108 in the associated column (e.g., through via/contact interconnections with transistor element), and 2$^{nd}$ BL_bar 204 coupled to 1$^{st}$ BL_bar one or more times for the associated column by way of the interconnections 702 and 704. It is noted that the embodiment of FIG. 1 illustrating the device 100 may also include the illustrated vias 702 and/or landing pads 704 in an embodiment of a memory device that may not require the complementary bit lines.

The interconnections 702 and 704 may include a suitable conductive material such as, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials. The landing pad 704 may be formed simultaneously with the metal lines of the associated metal layer (e.g., the metal layer interposing that of the 1$^{st}$ BL 110 and the 2$^{nd}$ BL 112).

Figure 8:
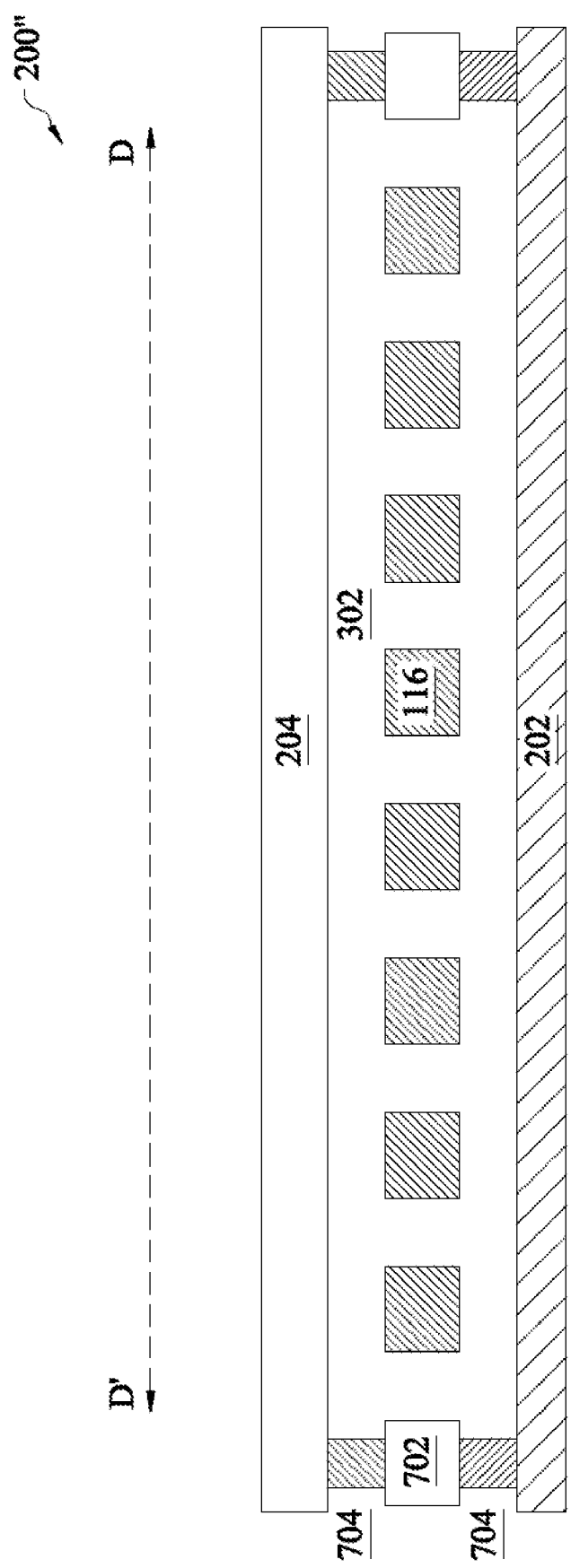
FIG. 8 illustrates an exemplary cross-sectional view according to embodiments of FIG. 7.

FIG. 8 illustrates a cross-sectional view of an embodiment of the device 200" along the D-D' cut line of FIG. 7. FIG. 8 illustrates an embodiment of the device 200" having the 1$^{st}$ BL_bar 202 on a first metal layer (e.g., M1), the WL 116 on a second, adjacent and overlying metal layer (e.g., M2), and the 2$^{nd}$ BL_bar 204 on a third metal layer, adjacent and overlying the second metal layer (e.g., M3). It is noted in this embodiment, that the second metal layer (including WL 116) is the next adjacent overlying metal layer to the first metal layer (including 1$^{st}$ BL_bar 202), and interposes the first metal layer and the third metal layer including the 2$^{nd}$ BL_bar 204. The landing pad 702 is coplanar with the second metal layer.

Figure 9A:
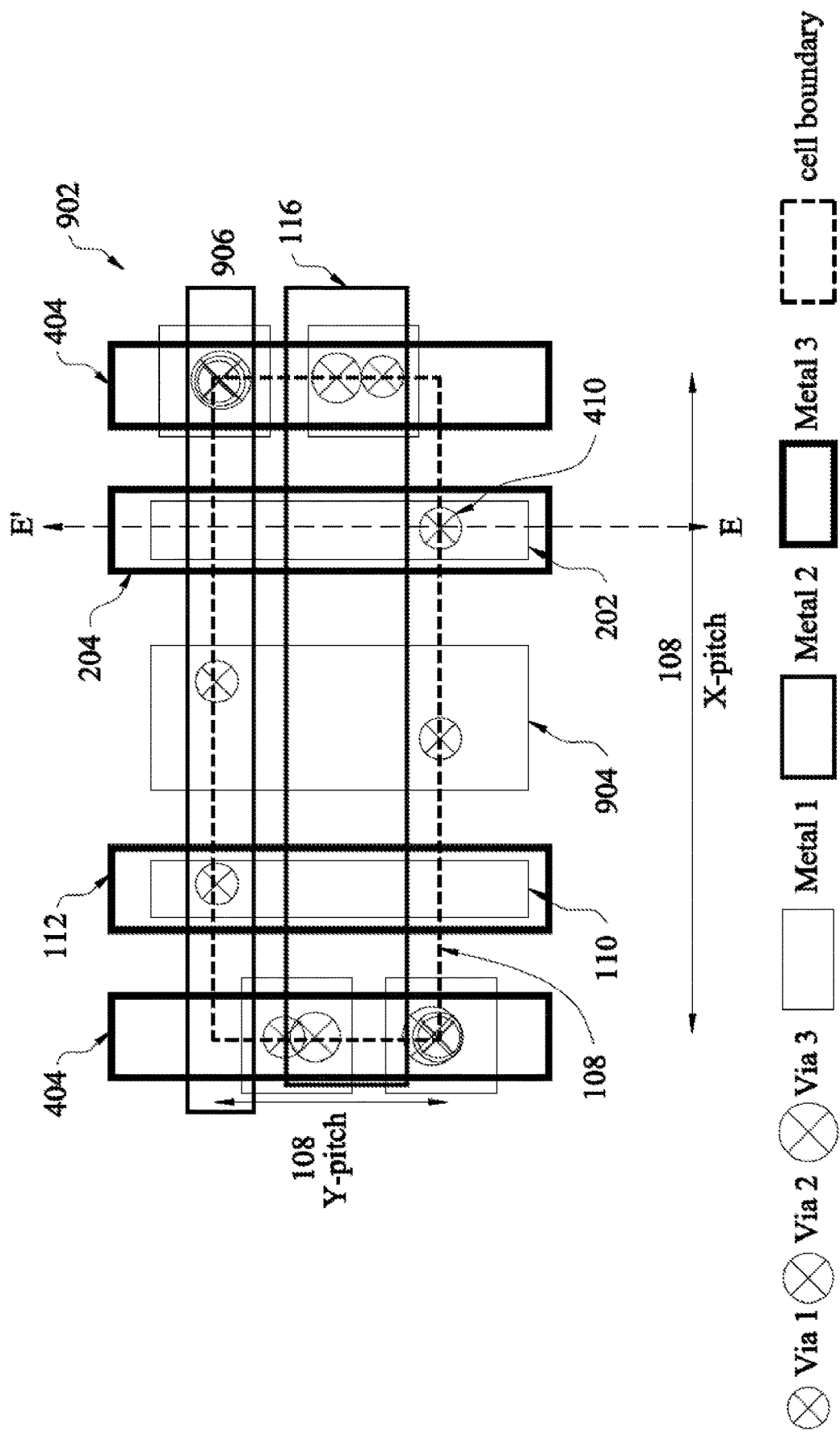
FIGS. 9A and 9B illustrate a layout view and a cross-sectional view according to various aspects of the present disclosure and to an example of an embodiment of FIG. 7.
Figure 9B:
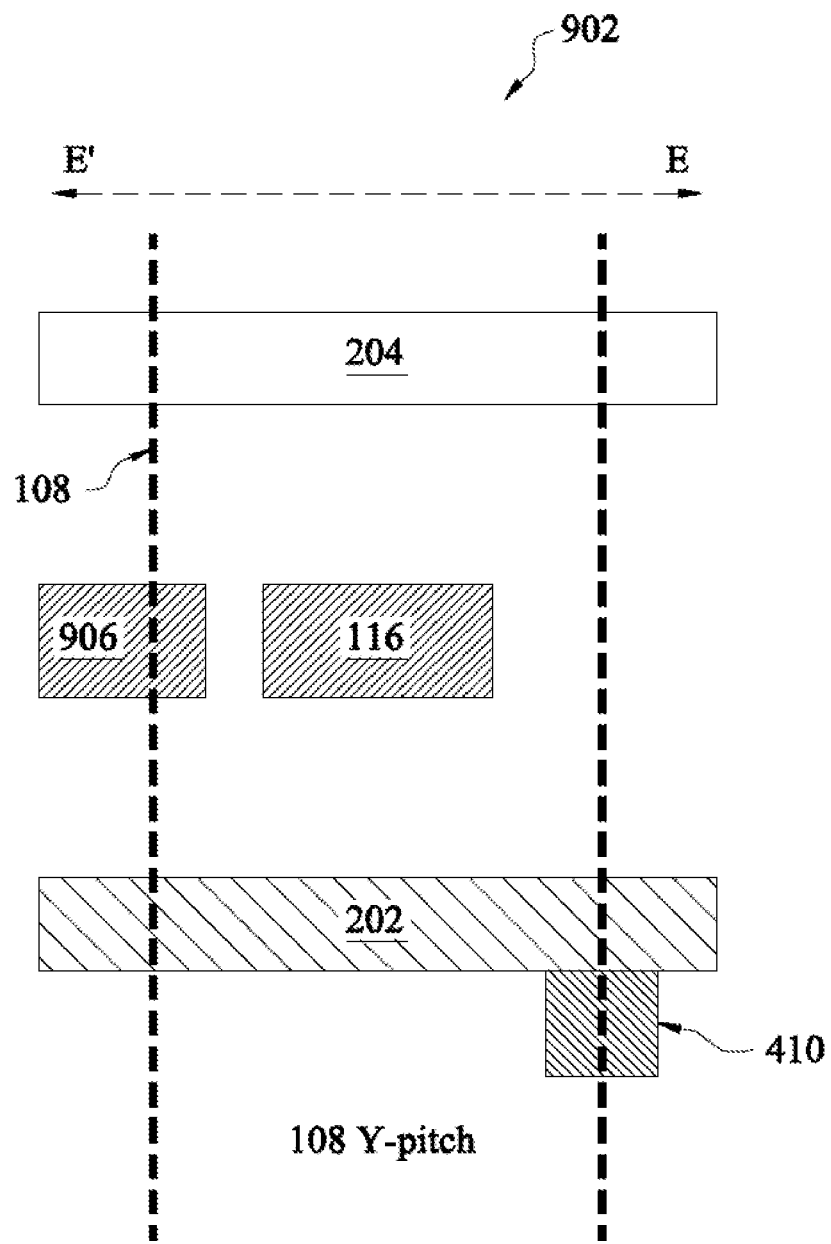

FIGS. 9A and 9B illustrate a layout view and a cross-sectional view respectively of a portion 902 of a memory device. In an embodiment, the portion 902 is an embodiment of the memory cell 108 of the memory device 200", described above with reference to FIGS. 7 and 8. The portion 902 may include the memory cell 108 as an SRAM memory cell. The layout portion 902 includes the 1$^{st}$ BL 110, the 2$^{nd}$ BL 112, the 1$^{st}$ BL_bar 202, the 2$^{nd}$ BL_bar 204 and the WL 116. The layout portion 902 further includes various Vdd lines (e.g., Metal 1) 904 and various Vss lines (e.g., Metal 2) 906.

In the illustrated embodiment shown in FIGS. 9A and 9B and the $1^{st}$ BL 110, the $1^{st}$ BL_bar 202 are each formed on a first metal layer (e.g., M1). The WL 116 is disposed on a second metal layer (e.g., M2) above and the next adjacent metal layer to the first metal layer. The $2^{nd}$ BL 112 and the $2^{nd}$ BL_bar 204 are formed on a third metal layer (e.g., M3) above the first metal layer and above the second metal layer, where the third metal layer is the next adjacent metal layer above the second metal layer. The Vss line 906 may be disposed on the second metal layer (e.g., M2). A plurality of vias are illustrated (circle encasing an "x") to show interconnection between the features. Via 410 illustrates an interconnection between $1^{st}$ BL_bar 202 and an underlying element of the memory cell 108. In an embodiment, the via 410 connects the $1^{st}$ BL_bar with the source/drain of a transistor of the memory cell 108 (e.g., a drain node of a pass-gate device in the cell 108 as an SRAM device). It is noted that the interconnection of the $1^{st}$ BL 110 and the $2^{nd}$ BL 112 is not illustrated in the portion 902 but would be present elsewhere in the array including the portion 902 (see above). It is noted that the interconnection of the $1^{st}$ BL_bar 202 and the $2^{nd}$ BL_bar 204 is not illustrated in the portion 902 but would be present elsewhere in the array including the portion 902 (see above). For example, these interconnections would include Via 2, Metal-2 landing pad, and Via 3 features.

FIG. 9B illustrates a corresponding cross-sectional view along cut E-E' of the layout portion 902 of FIG. 9A including the $1^{st}$ BL_bar 202, the WL 116, and the $2^{nd}$ BL_bar 204 on successive metal layers with via 410 providing a connection to the underlying element of the memory cell 108 (e.g., transistor such as electrically connected to a drain node of a pass-gate device of an SRAM). Vss line 906 is also illustrated disposed on a second metal layer.

Figure 10A:
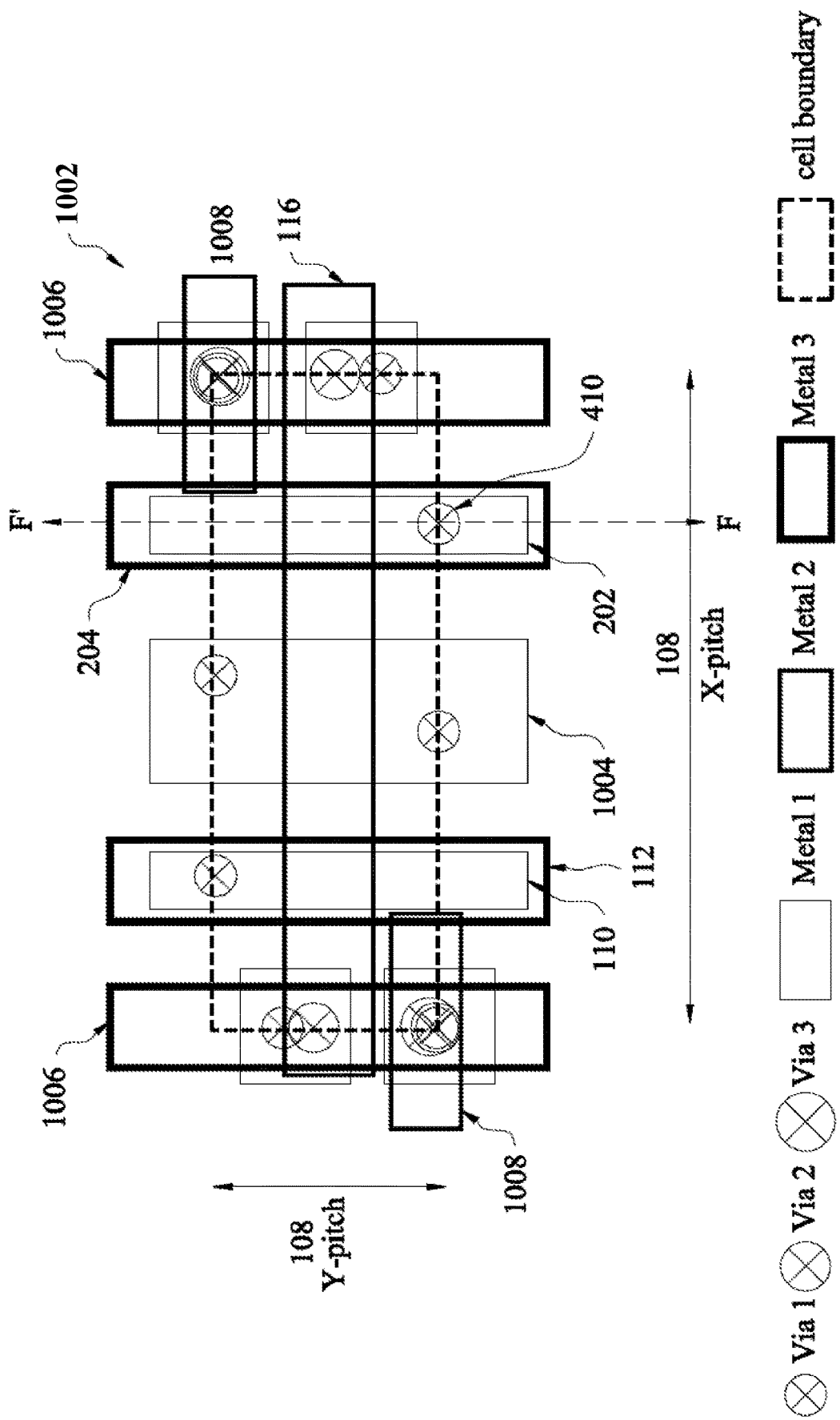
FIGS. 10A and 10B illustrate a layout view and a cross-sectional view according to various aspects of the present disclosure and to the embodiment of FIG. 7.
Figure 10B:
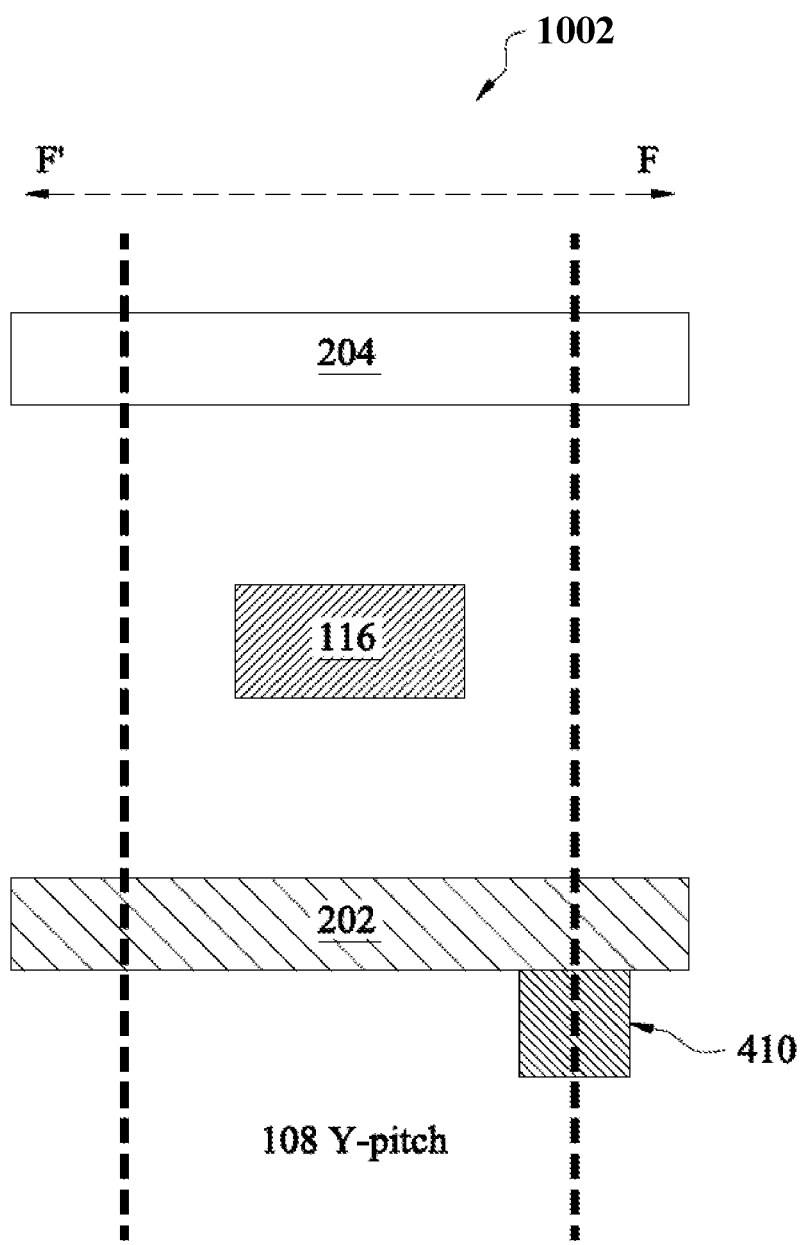

FIGS. 10A and 10B illustrate a layout view and a cross-sectional view respectively of a portion 1002 of a memory device. In an embodiment, the portion 1002 is an embodiment of the memory cell 108 of the memory device 200", described above with reference to FIGS. 7 and 8. The portion 1002 may include the memory cell 108 as an SRAM memory cell. The layout portion 1002 includes the $1^{st}$ BL 110, the $2^{nd}$ BL 112, the $1^{st}$ BL_bar 202, the $2^{nd}$ BL_bar 204 and the WL 116. The layout portion 1002 further includes various Vdd lines (e.g., Metal 1) 1004 and various Vss lines (e.g., Metal 3) 1006 and Vss landing pads (e.g., Metal 2) 1008.

In the illustrated embodiment shown in FIGS. 10A and 10B and the $1^{st}$ BL 110, the BL_bar 202 are each formed on a first metal layer (e.g., M1). The WL 116 is disposed on a second metal layer (e.g., M2) above and the next adjacent metal layer to the first metal layer. The $2^{nd}$ BL 112 and the $2^{nd}$ BL_bar 204 are formed on a third metal layer (e.g., M3) above the first metal layer and above the second metal layer, where the third metal layer is the next adjacent metal layer above the second metal layer. A plurality of vias are illustrated (circle encasing an "x") to show interconnection between the features. Via 410 illustrates an interconnection between $1^{st}$ BL_bar 202 and an underlying element of the memory cell 108. In an embodiment, the via 410 connects the $1^{st}$ BL_bar with the source/drain of a transistor of the memory cell 108 (e.g., a drain node of a pass-gate device in the cell 108 as an SRAM device). It is noted that the interconnection of the $1^{st}$ BL 110 and the $2^{nd}$ BL 112 is not illustrated in the portion 1002, but would be present elsewhere in the array including the portion 1002 (see above). It is noted that the interconnection of the $1^{st}$ BL_bar 202 and the $2^{nd}$ BL_bar 204 is not illustrated in the portion 1002 but would be present elsewhere in the array including the portion 1002 (see above). For example, these interconnections would include Via 2, Metal 2 (landing pad), and Via 3 features.

FIG. 10B illustrates a corresponding cross-sectional view along cut F-F' of the layout portion 1002 of FIG. 10A including the $1^{st}$ BL_bar 202, the WL 116, and the 2nd BL_bar 204 on successive metal layers with via 410 providing a connection to the underlying element of the memory cell 108 (e.g., transistor such as electrically connected to a drain node of a pass-gate device of an SRAM).

Figure 11:
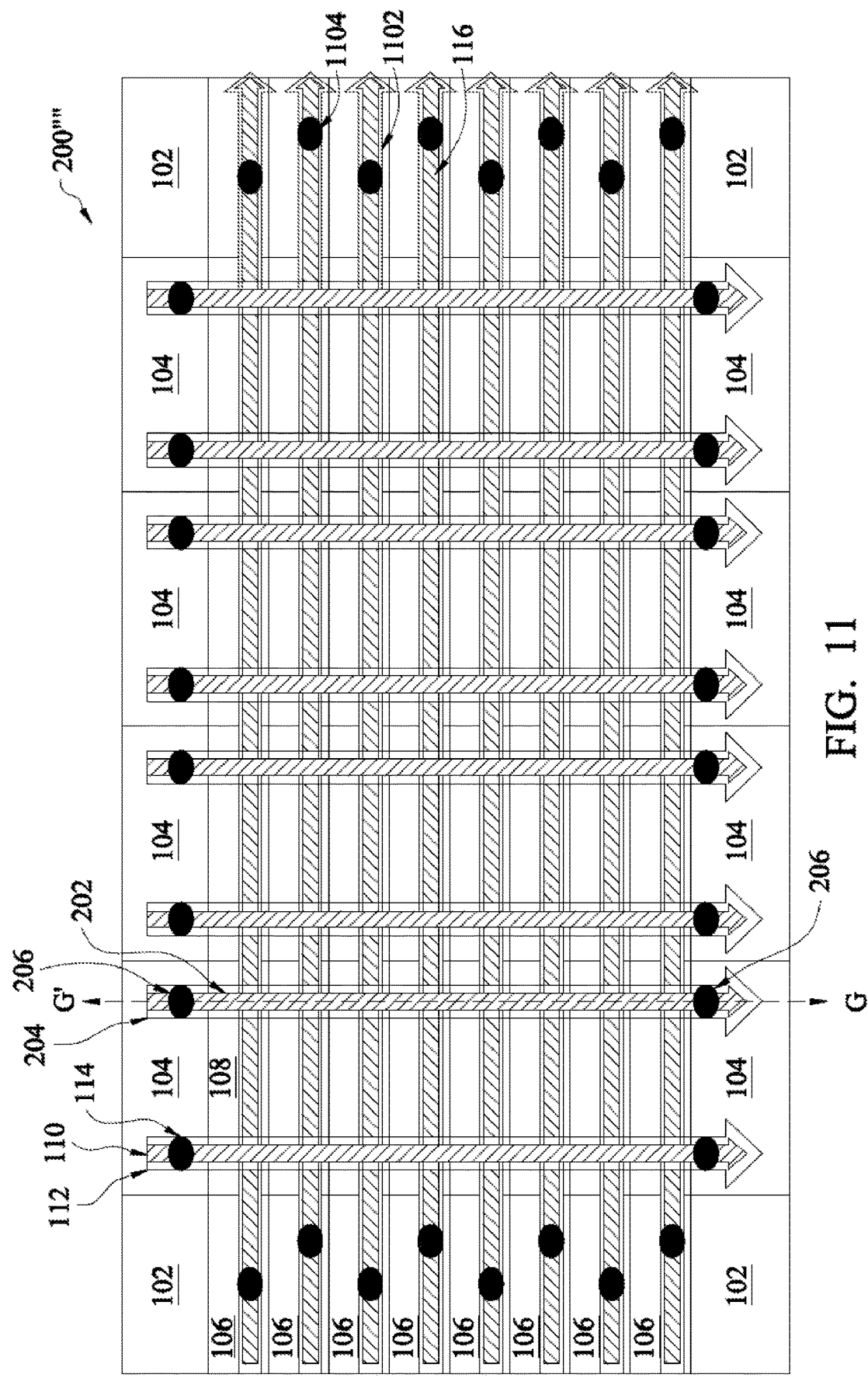
FIG. 11 illustrates a top view of a layout of an array of semiconductor memory cells according an embodiment of the present disclosure having a double word line configuration.

FIG. 11 illustrates a top view of an embodiment of the memory device 200, denoted memory device 200'''. The memory device 200''' may be substantially similar to the embodiments discussed above with an additional word line (dual word line configuration) provided in device as discussed in detail below. It is noted that the device 200''' of FIG. 11 includes the $1^{st}$ BL 110 and the $2^{nd}$ BL 112, the $1^{st}$ BL_bar 202 and the $2^{nd}$ BL_bar 204. In other embodiments, the memory device 200''' may not include complement bit lines. In the embodiment of device 200''' as illustrated in FIG. 11, the $2^{nd}$ BL 112 is coupled to the $1^{st}$ BL 110 using via 114 over the edge cell 104 (as with the coupling with the $1^{st}$ and $2^{nd}$ complement bit lines). However, in other embodiments the interconnection may be disposed over other regions of the device 200''' including as illustrate above at FIGS. 5 and 7. See also, FIGS. 12 and 13.

The device 200''' has the $1^{st}$ WL 116, which may be substantially similar to as discussed above, and additionally a $2^{nd}$ WL 1102. The $1^{st}$ WL and the $2^{nd}$ WL are each associated with a single row of the memory device. In some embodiments, the dual word line configuration having the $1^{st}$ WL 116 and the $2^{nd}$ WL 1102 for a given row, may provide benefits such as a reduction in resistance. The $1^{st}$ WL 116 and $2^{nd}$ WL 1102 are coupled to one another at interconnections 1104. The interconnections 1104 include suitable vias and/or conductive landing pads that provide electrical connection between the $1^{st}$ WL 116 and the overlying $2^{nd}$ WL 1102. The $1^{st}$ WL 116 may be provided at Mz and the $2^{nd}$ WL 1102 is provided at Mz+b, wherein b is 1 or more. In an embodiment, z is equal to 3 and b is equal to 1. In another embodiment, z is equal to 2 and b is equal to 2. In other words, in an embodiment, the $1^{st}$ WL 116 is provided on M2 and the $2^{nd}$ WL 1102 is provided on M4.

In some embodiments, the $1^{st}$ WL 116 is coupled to the $2^{nd}$ WL 1102 at one location in the device 200''' (e.g., one interconnection 1104). In some embodiments, the $1^{st}$ WL 116 and the $2^{nd}$ WL 1102 are coupled at least two places for the row of cells 108, see interconnections 1104. In the illustrated embodiment of FIG. 11, the interconnection between the $1^{st}$ WL 116 and the $2^{nd}$ WL 1102 for a given row is disposed over the edge cell region 106 at the edge of the array. In other embodiments, other locations of this interconnection may be provided. For example, in other embodiments, the $1^{st}$ WL 116 and the $2^{nd}$ WL 1102 are coupled at a plurality of positions within the array of cells 108 including substantially similar to as discussed above with reference to FIG. 5 and the interconnections of the dual bit line configuration. In an embodiment, the $1^{st}$ WL 116 is coupled to each and every addressable cell 108 in the row (e.g., to pass-gate transistor of the cell 108) via appropriate via configurations. See for example, the interconnections defined by exemplary memory cells of FIGS. 17, 18, and 19 below. In a further embodiment, the 2$^{nd}$ WL 1102 is connected to the addressable cell 108 (e.g., pass-gate transistor) only through the 1$^{st}$ WL 116.

In an embodiment, one of the 1$^{st}$ WL 116 and the 2$^{nd}$ WL 1102 extends to the control circuitry for the array of memory cells 108. In a further embodiment, the other one of the 1$^{st}$ WL 116 and the 2$^{nd}$ WL 1102 terminates without directly connecting to the control circuitry. For example, in an embodiment, the 2$^{nd}$ WL 1102 terminates beyond in the interconnection 1104 but at a point prior to connection with the control circuitry for the array. In another embodiment, the 2$^{nd}$ WL 1102 extends to the control circuitry and the 1$^{st}$ WL 116 terminates beyond in the interconnection 1104 but at a point prior to connection with the control circuitry for the array. In other words, in an embodiment, the control circuitry asserts one of the 1$^{st}$ WL 116 and the 2$^{nd}$ WL 1102 (the other word line being not connected to the control circuitry). Nonetheless due to their interconnection, both the 1$^{st}$ WL 116 and 2$^{nd}$ WL 1102 are provided at the same state. (It is noted, as with the illustrated bit lines, that the difference of width in the 1$^{st}$ WL 116 and the 2$^{nd}$ WL 1102 are for ease of reference and not intended to necessitate such a configuration.) For example, the voltage on the 1$^{st}$ WL 116 may be raised or lowered by a driver element. In an embodiment, the 1$^{st}$ WL 116 is directed coupled to the driver element, while the 2$^{nd}$ WL 1102 is coupled to the 1$^{st}$ WL 116 and receives the state (e.g., voltage) only through the 1$^{st}$ WL 116.

The 1$^{st}$ WL 116 and the 2$^{nd}$ WL 1102 may be conductive materials including, for example, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials.

Figure 12:
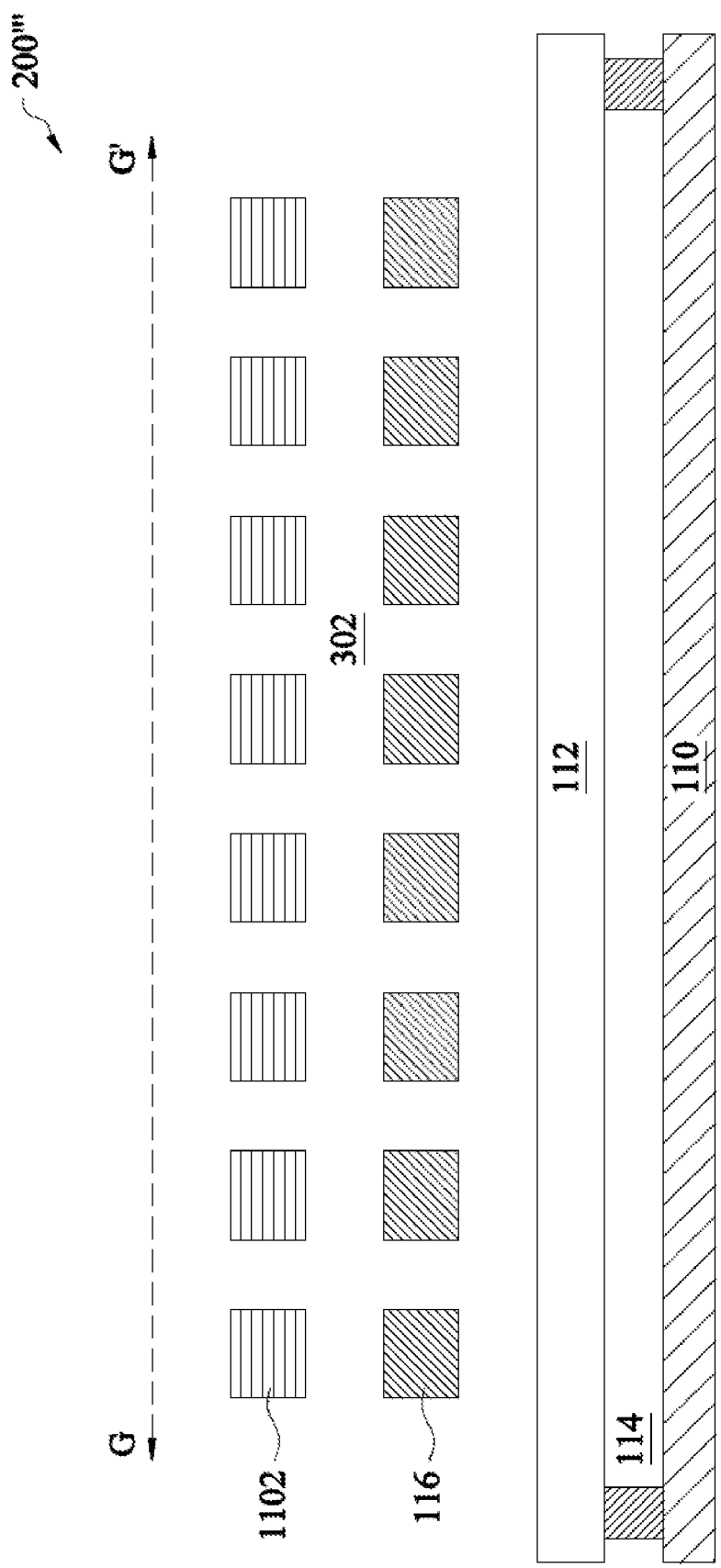
FIG. 12 illustrates an exemplary cross-sectional view according to an embodiment of FIG. 11.
Figure 13:
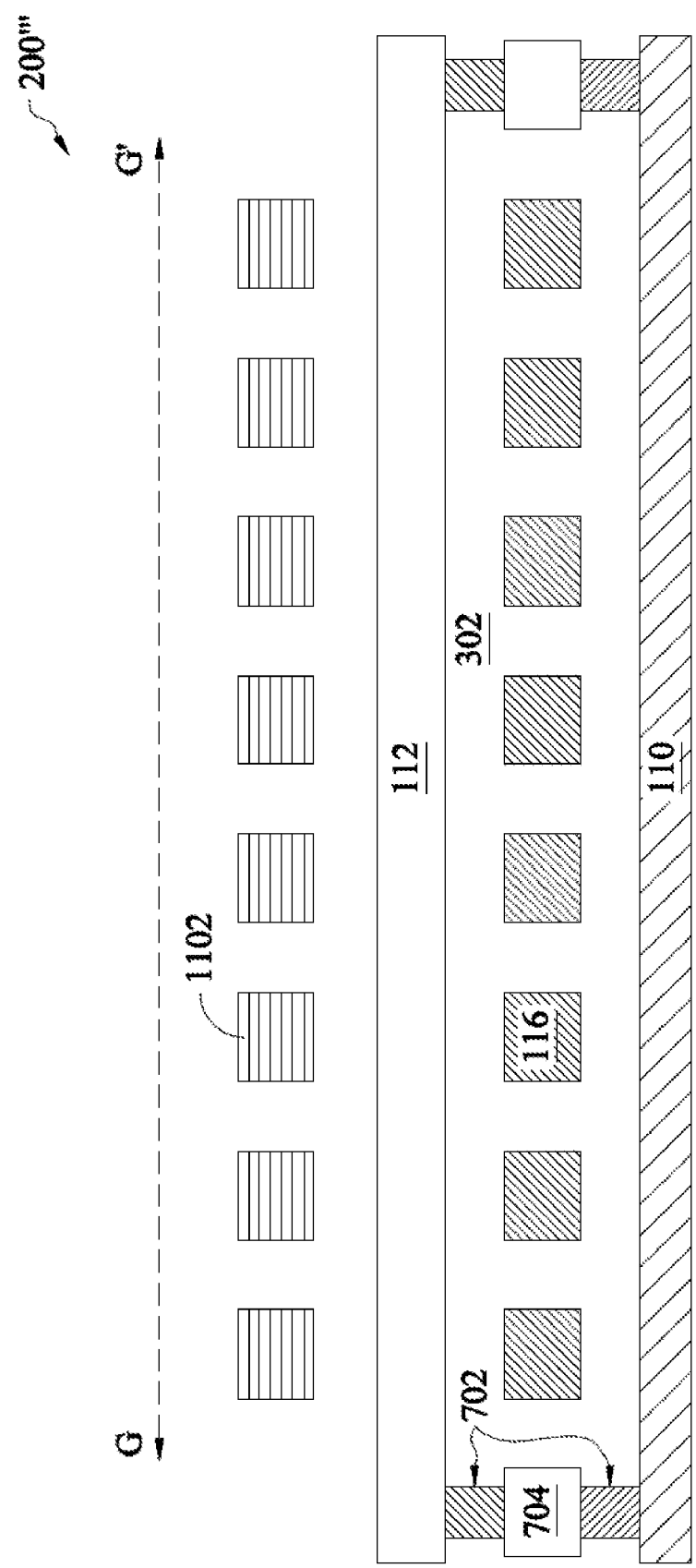
FIG. 13 illustrates an exemplary cross-sectional view according to an embodiment of FIG. 11.

FIGS. 12 and 13 illustrate cross sectional views of two different embodiments of the device 200''' of FIG. 11. FIG. 12 illustrates the 1$^{st}$ BL 110 disposed on the first metal line (e.g., M1) and the 2$^{nd}$ BL 112 disposed on a second metal line (e.g., M2). The second metal line may be the next adjacent metal line above the first metal line. Thus, in an embodiment, the 1$^{st}$ BL 110 and the 2$^{nd}$ BL 112 are coupled by via 114 (e.g., Via 1) extending from the first metal layer to the second metal layer. In the embodiment illustrated in FIG. 12, the 1$^{st}$ WL 116 is disposed on a third metal line and the 2$^{nd}$ WL 1102 is disposed on a forth metal line. The fourth metal line may be the next adjacent metal line above the third metal line. Thus, in an embodiment, the 1$^{st}$ WL 116 and the 2$^{nd}$ WL 1102 may be coupled using a via (not shown) extending from the third metal line to the fourth metal line (e.g., Via 4).

FIG. 13 illustrates the 1$^{st}$ BL 110 disposed on the first metal line (e.g., M1) and the 2$^{nd}$ BL 112 disposed on a third metal line (e.g., M3). The 1$^{st}$ WL 116 is disposed on the interposing second metal line (e.g., M2). The 2$^{nd}$ WL 1102 is disposed on the fourth metal line (e.g., M4). Thus, in an embodiment, the 1$^{st}$ BL 110 and the 2$^{nd}$ BL 112 are coupled by vias 702 and landing pad 704 (e.g., Via 2, Metal 3 landing pad, and via 3) extending from the first metal layer to the third metal layer. In the embodiment of FIG. 13, the 1$^{st}$ WL 116 is disposed on second metal line and the 2$^{nd}$ WL 1102 is disposed on a forth metal line, the 2$^{nd}$ BL 112 on the interposing third metal line. Thus, in an embodiment, the 1$^{st}$ WL 116 and the 2$^{nd}$ WL 1102 may be coupled using vias and landing pads extending from the second metal line to the fourth metal line (e.g., Via 3, landing pad at Metal 3, via 4).

Figure 14A:
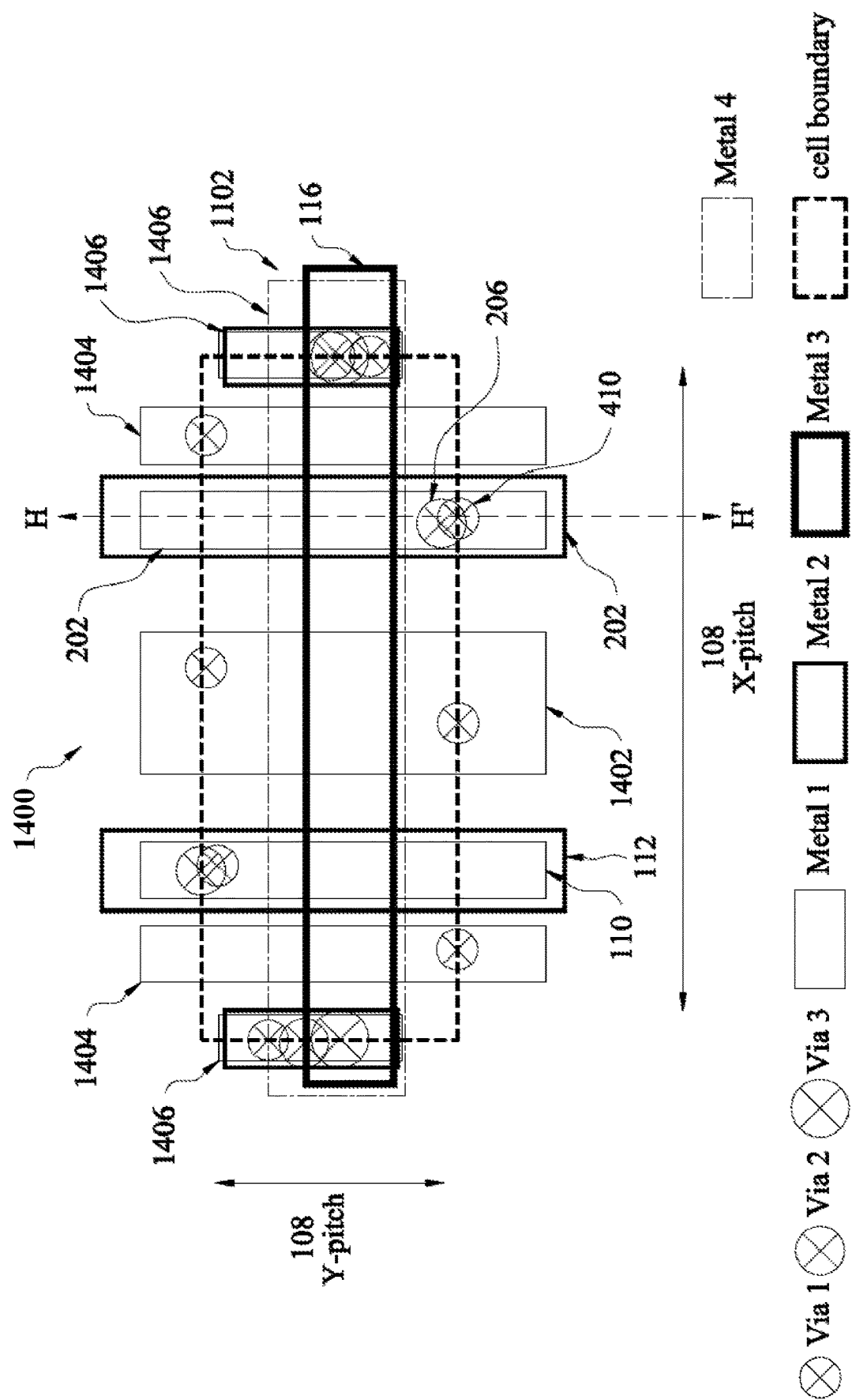
FIGS. 14A and 14B illustrate a layout view and a cross-sectional view according to various aspects of the present disclosure and to an embodiment of the device of FIG. 11.
Figure 14B:
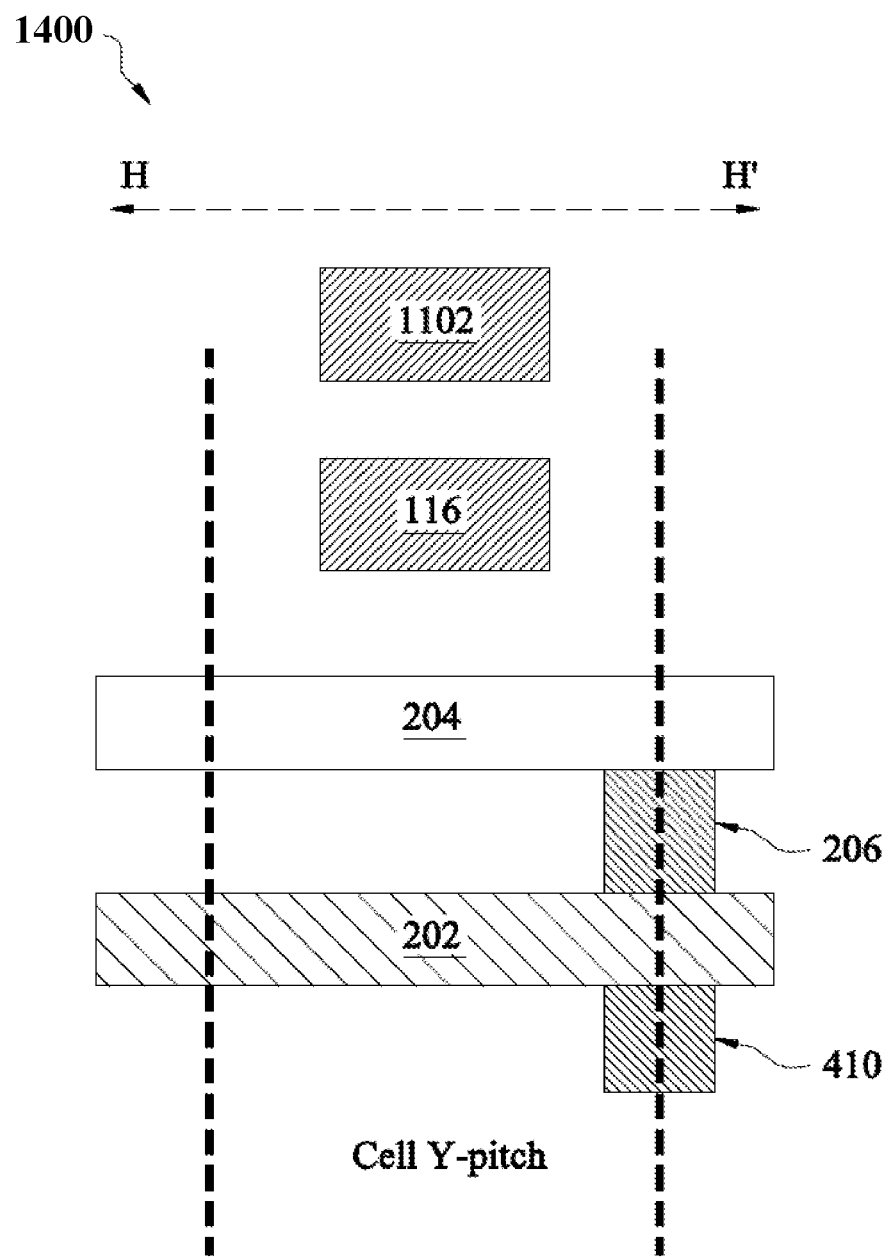

FIGS. 14A and 14B illustrate a layout view and a cross-sectional view respectively of a portion 1400 of a memory device. In an embodiment, the portion 1400 is an embodiment of the memory cell 108 of the memory device 200''', described above with reference to FIGS. 12 and 13. The portion 1400 may include the memory cell 108 as an SRAM memory cell. The layout portion 1400 includes the 1$^{st}$ BL 110, the 2$^{nd}$ BL 112, the 1$^{st}$ BL_bar 202, the 2$^{nd}$ BL_bar 204, the 1$^{st}$ WL 116, and the 2$^{nd}$ WL 1102. The layout portion 1400 further includes various Vdd lines (e.g., Metal 1) 1402 and various Vss lines (e.g., Metal 1) 1404 and word-line landing pads (e.g., Metal 1, Metal 2) 1406.

In the illustrated embodiment shown in FIGS. 14A and 14B, the 1$^{st}$ BL 110, the 1$^{st}$ BL_bar 202 are each formed on a first metal layer (e.g., M1). The 2$^{nd}$ BL 112 and the 2$^{nd}$ BL_bar 204 are formed on a second metal layer (e.g., M2) the next adjacent metal layer above the first metal layer. Thus, the via 206 extends from the 1$^{st}$ BL 110 to the 2$^{nd}$ BL 112 connecting the bit lines. The 1$^{st}$ WL 116 is disposed on a third metal layer (e.g., M3) above and the next adjacent metal layer to the second metal layer. The 2$^{nd}$ WL 1102 is disposed on a fourth metal layer (e.g., M4) above and the next adjacent metal layer to the third metal layer. A via (not shown) may connect the 1$^{st}$ WL 116 and the 2$^{nd}$ WL 1102.

Figure 17:
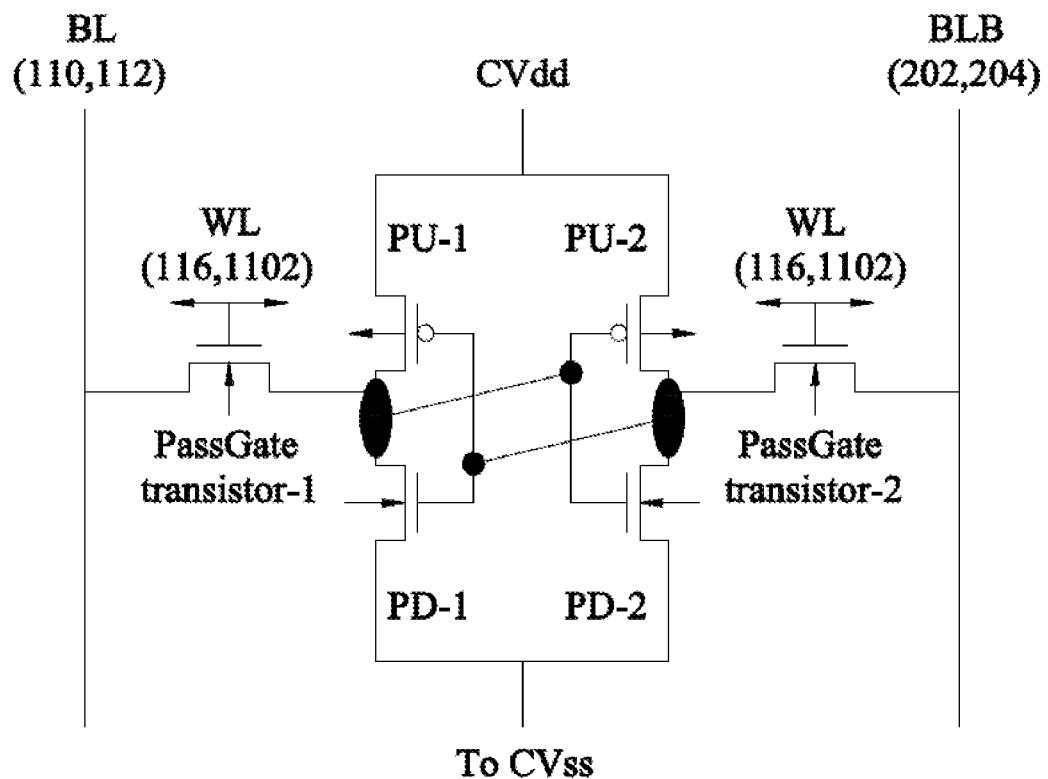
FIGS. 17, 18 and 19 illustrate exemplary schematic views of memory cells that may be constructed according to various aspects of the present disclosure.
Figure 17:
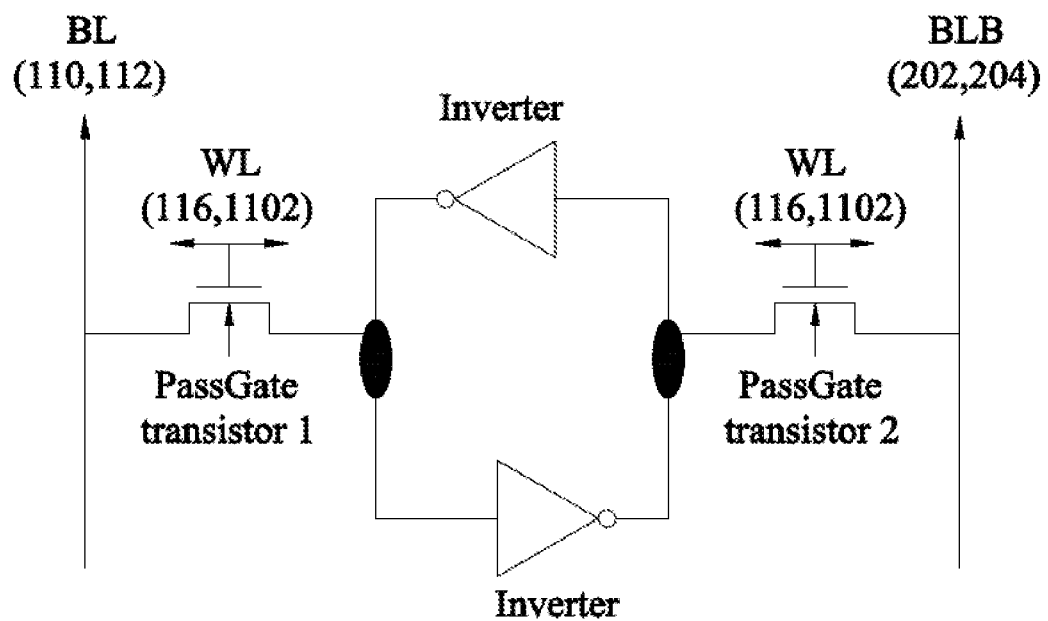
Figure 18:
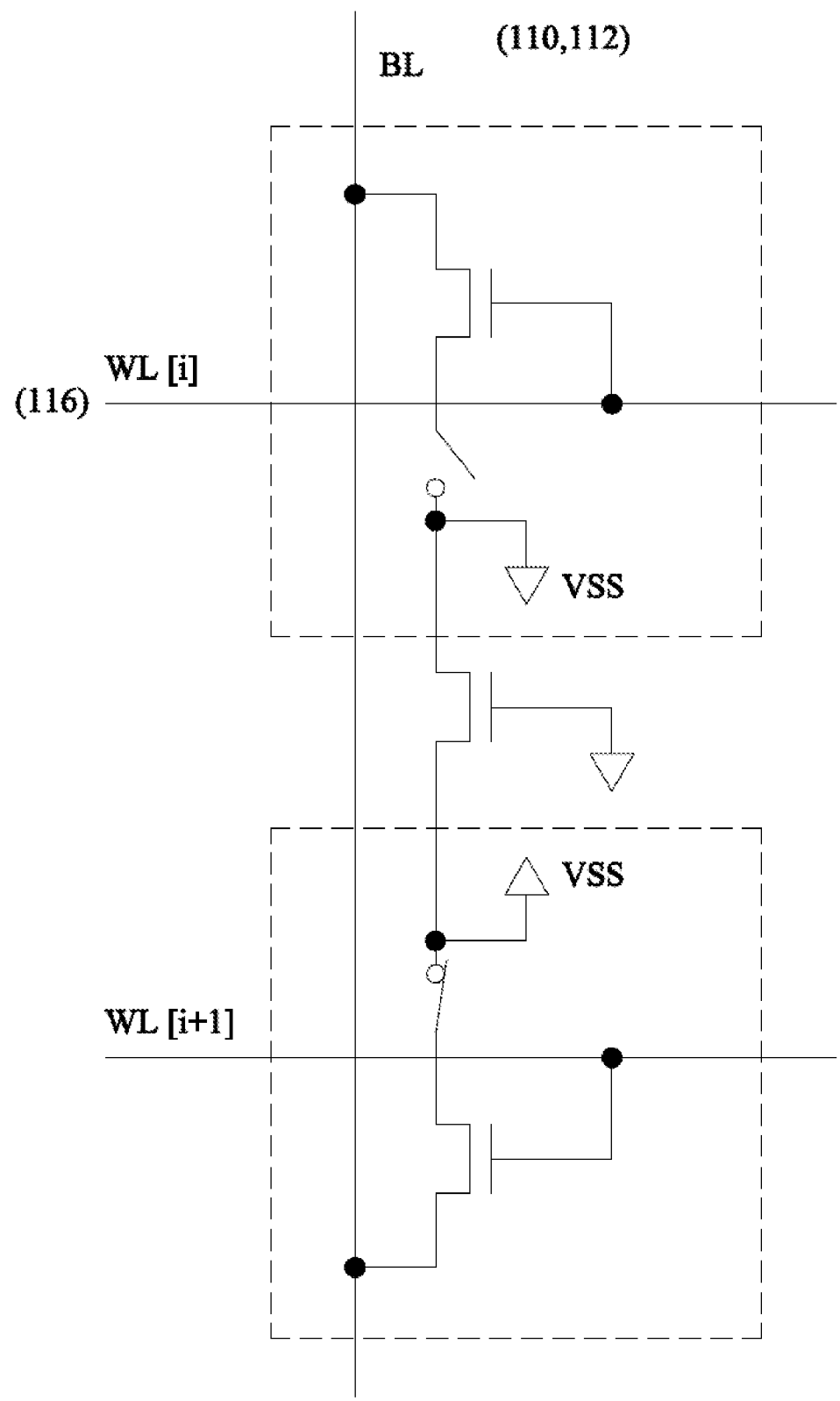
Figure 19:
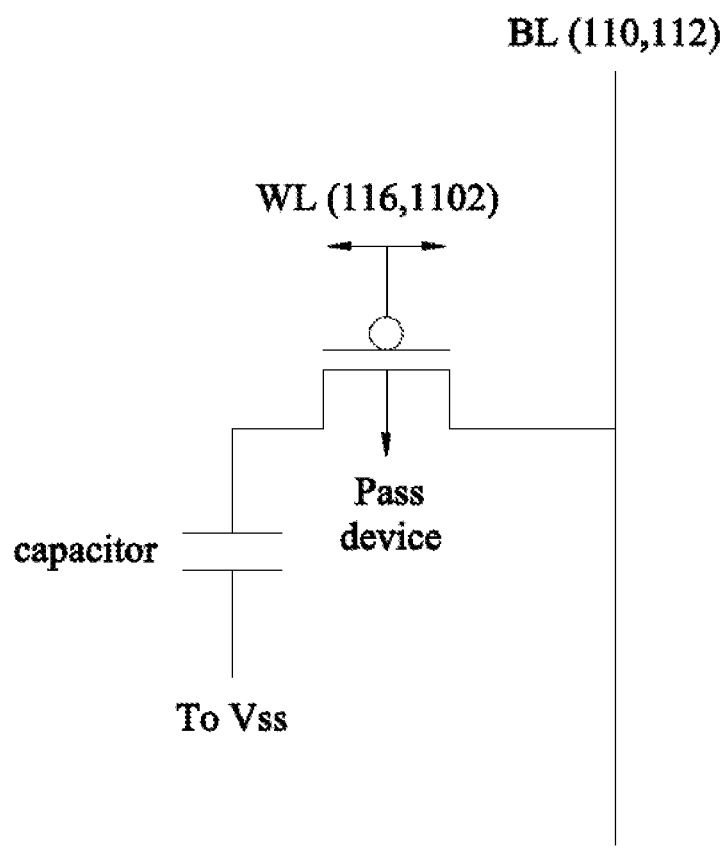

Via 410 illustrates an interconnection between 1$^{st}$ BL_bar 202 and an underlying element of the memory cell 108 including for example as detailed in FIGS. 17, 18, and 19. In an embodiment, the via 410 connects the 1$^{st}$ BL_bar with the source/drain of a transistor of the memory cell 108 (e.g., a drain node of a pass-gate device in the cell 108 as an SRAM device). FIG. 14B illustrates a corresponding cross-sectional view along cut H-H' of the layout portion 1400 of FIG. 14A including the 1$^{st}$ BL_bar 202, the 2$^{nd}$ BL_bar 204, the 1$^{st}$ WL 116, and the 2$^{nd}$ WL 1102 on successive metal layers with via 410 providing a connection to the underlying element of the memory cell 108 (e.g., transistor such as electrically connected to a drain node of a pass-gate device of an SRAM).

Figure 15:
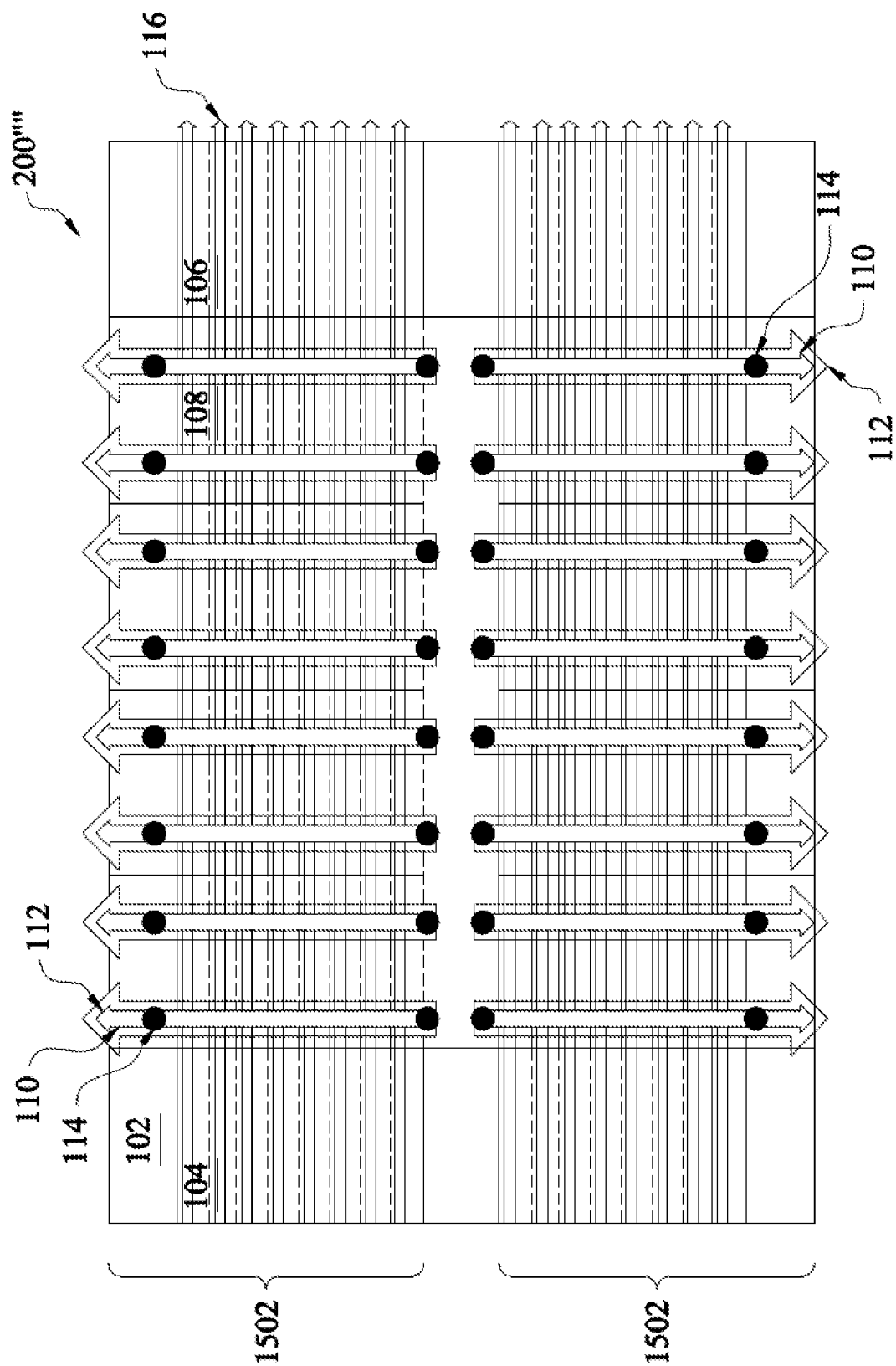
FIG. 15 illustrates a top view of a layout of a memory device having a plurality of sub-arrays of memory cells according an embodiment of the present disclosure.

FIG. 15 illustrates a memory device 200'''' including memory cells 108 configured and operated as a plurality of sub-arrays 1502. Some embodiments of the memory device 200'''' having a plurality of sub-arrays may provide for improvements such as, for example, enhancing memory speed as accessing smaller sub-arrays can be faster than accessing a single large array. Aspects of any one or more of the embodiments of the memory device 200 discussed above may be applied to the configuration of the memory device 200'''' (e.g., additional WL, additional interconnections between 1$^{st}$ BL 110 and 2$^{nd}$ BL 112, additional connections between the 1$^{st}$ BL_bar 202 and the 2$^{nd}$ BL_bar 204, interconnections between BL on non-adjacent metal layers using landing pads, and/or other features discussed above). FIG. 15 provides an example embodiment of a memory device 200'''' having two sub-arrays; however any number of sub-arrays and sub-arrays of any size are possible. In an embodiment, the memory device 200'''' is a multi-array SRAM.

Figure 16:
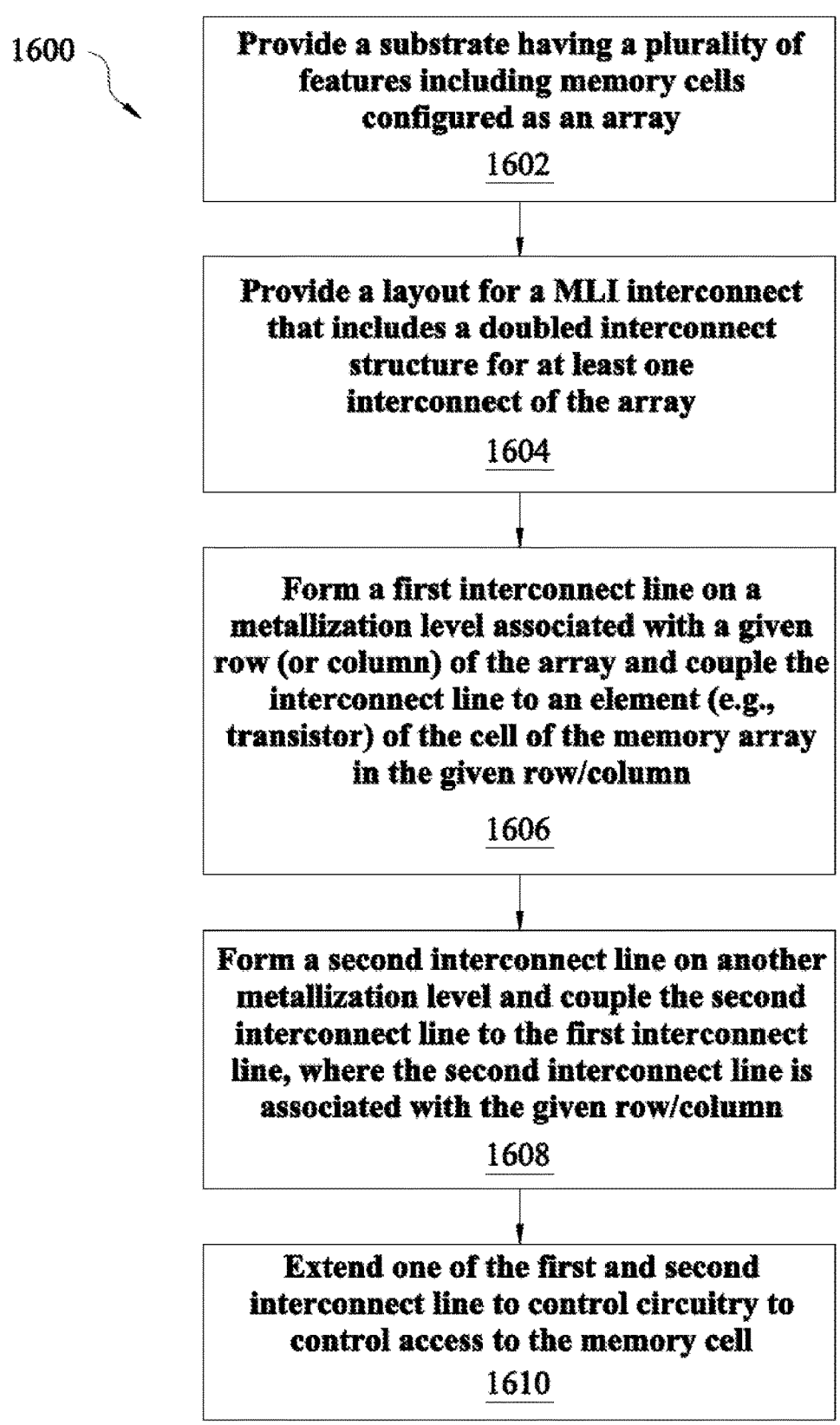
FIG. 16 illustrates a flow chart that provides an exemplary method of fabricating devices according to one or more aspects of the present disclosure.

FIG. 16 illustrates a method 1600 of fabricating a memory device that may be used to fabricate one or more of the memory devices discussed above with reference to FIGS. 1-15. The method 1600 begins at block 1602 where a substrate having a plurality of features defined thereon including memory cells configured in an array is provided. The memory cells may be SRAM, DRAM, ROM, and/or other suitable memory types. In an embodiment, the memory cells may be substantially similar to as discussed above with reference to memory cells 108.

The method 1600 then proceeds to block 1604 where a layout for a multi-layer interconnect (MU) that includes a doubled or dual interconnect structure for at least one of a bit line, a complementary bit line, or a word line is provided. The doubled or dual interconnect structure may be substantially similar to as discussed above with reference to FIGS. 1-15. In an embodiment, the doubled interconnect structure includes a first bit line on a first metal layer and associated with a column of a memory array and further includes a second bit line disposed on a higher metal layer than the first bit line, coupled to the first bit line, and also associated with the same column of the memory array. In an embodiment, the doubled interconnect structure includes a first complementary bit line on a first metal layer and associated with a column of a memory array and further includes a second complementary bit line disposed on a higher metal layer than the first complementary bit line, coupled to the first complementary bit line, and also associated with the column of the memory array. In an embodiment, the doubled interconnect structure includes a first word line on a metal layer and associated with a row of a memory array and further includes a second complementary bit line disposed on a higher metal layer than the first word line, coupled to the first word line, and also associated with the row of the memory array. Block 1604 may include providing a layout substantially similar to any one of the layouts discussed above including those of FIGS. 1, 2, 4A, 5, 7, 9A, 10A, 11, 14A, and/or 15.

The method 1600 then proceeds to block 1606 where a first interconnect line on a metallization level associated with a given row (or column) of the array and couple the interconnect line to an element (e.g., transistor) of the cell of the memory array in the given row/column. The first interconnect line is formed according to the layout provided in the block 1604. The interconnect line may be formed of Cu, Co, Ni, Ru, W, Al, conductive alloys, combinations thereof. The interconnect line may be formed by depositing conductive material into patterned openings in a dielectric. In some embodiments, the deposition of conductive material is followed by suitable etch back or chemical mechanical polishing processes. In some embodiments, adjacent vias may be formed simultaneously with the formation of the first interconnect line (e.g., damascene processes).

The method of 1600 then proceeds to block 1608 where a second interconnect line is formed on another metallization level and coupled the second interconnect line to the first interconnect line, where the second interconnect line is associated with the given row/column. A via that interconnects the interconnect line of block 1606 and the second interconnect line of block 1608 may be formed with the second interconnect line. The interconnect line may be formed of Cu, Co, Ni, Ru, W, Al, conductive alloys, combinations thereof. The interconnect line may be formed by depositing conductive material into patterned openings in a dielectric. In some embodiments, the deposition of conductive material is followed by suitable etch back or chemical mechanical polishing processes. In some embodiments, adjacent vias may be formed simultaneously with the formation of the first interconnect line (e.g., damascene processes).

The method 1600 further includes the layout and/or deposition process defining that one of the first interconnect line of block 1606 and the second interconnect line 1608 are connected with peripheral circuitry of the memory device as illustrated in block 1610. Thus, in performing a read or write operation of the memory cells, the first interconnect line and the second interconnect line are (e.g, at the array or addressable cell) provided at the same state.

FIGS. 17, 18, and 19 illustrate various schematics of memory cells that may be implemented using aspects of the present disclosure discussed above. Any one or more of the memory cells 108, discussed above, may be represented by the schematics (e.g., transistors, capacitors) of FIGS. 17, 18, and/or 19. Further, the illustrated bit lines (BL), complementary bit lines (BLB), and word lines (WL) illustrated in the schematic may be implemented as discussed above with reference to $1^{st}$ BL 110, the $1^{st}$ BL_bar 202, and the WL 116. For example, the trace BL in the schematics may be fabricated as a $1^{st}$ BL 110 and $2^{nd}$ BL 112, where the $1^{st}$ BL 110 provides the connection as illustrated by the schematic and the $2^{nd}$ BL 112 is similarly connected to the cell via the $1^{st}$ BL. As another example, the single trace complement bit line BLB may be fabricated as a dual complement bit line structure, for example $1^{st}$ BL_bar and $2^{nd}$ BL_bar above, where the $1^{st}$ BL_bar 202 provides the connection as illustrated by the schematic and the $2^{nd}$ BL_bar 204 is similarly connected to the cell via the BL_bar 202. FIG. 17 illustrates exemplary single-port SRAM cell circuits. FIG. 18 illustrates an exemplary ROM cell. FIG. 19 illustrates an exemplary DRAM cell. These schematics are exemplary only; for example, a 6T transistor SRAM cell is illustrated in FIG. 17, however, other configurations are possible including dual-port SRAM cells.

FIG. 20 illustrates a substrate 2001 having a plurality of gates 2002 and overlying multi-layer interconnect 2004 which includes a plurality of metal layers and interposing vias (Via 1, M1, via 2, M2, via 3, M3, via 4, M4). The exemplary MLI 2004 may be used to implement any one of the above described embodiments for a memory device.

The gates such as gate 2002 may be used to form a transistor or portion thereof (including as illustrated in FIGS. 17, 18 and 19) of the memory cell such as memory cell 108, discussed above. The gate 2002 may include a gate electrode and underlying gate dielectric. A source/drain region 2004 lies adjacent the gate 2002 forming the transistor. In an embodiment, one or more gates are transistors of the memory cell 108 and the source/drain 2004 is electrically connected to the $1^{st}$ BL (e.g. BL 110) or $1^{st}$ BL_bar (e.g., BL_bar 202) formed in Metal 1 (M1). This interconnection is provided through a via (e.g., via 1 extending below Metal 1), substantially similar to via 410 discussed above, and an underlying contact element. The contact element may be tungsten, silicide, or other suitable conductive material.

The present disclosure provides for an interconnect architecture for memory cells of an array that can reduce the resistance by enhancing the interconnect paths between and among points in the memory device (e.g., array and/or peripheral devices). The enhanced interconnect paths include providing one or more of an additional bit line, an additional complement bit line (bit line bar), an additional word line, and/or other configurations as discussed herein. The enhanced interconnect paths may be referred to as a double line or a strap structure. The enhanced interconnect provides an additional conductive path between two or more points provided by a given metal line (e.g., BL) on a first metal layer by providing the path/interconnection or portion thereof also on a second metal layer. In some embodiment, a double bit line structure is provided. In an embodiment, a double bit line bar (or complement to the bit line) structure is provided. In an embodiment, a double word line structure is provided. One or more of these embodiments may be provided concurrently for a memory device.

In an embodiment, a memory device is provided having an array of memory cells arranged in columns and rows. Any number of rows or columns may be provided. The memory device includes a first bit-line coupled to memory cells in a first column of the array. A second bit-line is coupled to the first bit-line and thus, also the memory cells in the first column of the array. The second bit line may be disposed on a different metal layer (e.g., of the MLI) than the first bit line. In an embodiment, the second bit line is coupled to the first bit line at least twice. For example, the lines may be coupled by a first via that extends between the first bit line and the second bit line and a second via spaced a distance from the first via that also extends between the first bit line and the second bit line. In an embodiment of the configuration, a single word line is coupled to memory cells of a first row of the array. In other embodiments, a double word line configuration is provided as discussed below. Each of the first and second bit lines and the word line may be formed on different metallization layers, for example, different layers of the MLI.

Thus, in an embodiment provided is a memory array having a plurality of cells where a first bit line coupled to the a first column of the array and a first word line coupled to a first row of the array. The embodiment may further include a second bit-line coupled to the first bit-line at least twice for the first column of the array. The embodiment may further include a second word line coupled to the first word line at least twice for the first row of the array. The first and second bit-lines are formed on different metallization layers, but associated with the same column. The first and second word-lines are formed on different metallization layers, but associated with the same row.

Thus, in some embodiments there is provided a memory device including an array of memory cells, a first bit-line coupled to memory cells of a first column of the array of memory cells, wherein the first bit-line is disposed on a first metal layer; a second bit-line coupled to the first bit-line, wherein the second bit-line is disposed on a second metal layer and coupled to the first bit-line by at least one via; and a word line coupled to a row of the array of memory cells.

In some embodiments, a memory device is described that has an array of memory cells. A first bit-line is coupled to memory cells of a first column of the array of memory cells. The first bit-line is disposed on a first metal layer. A second bit-line is coupled to the first bit-line. The second bit-line is coupled to the first bit-line and the second bit-line is disposed on a second metal layer above the first metal layer. A first complement bit-line coupled to memory cells of the first column of the array of memory cells. The first complement bit-line is disposed on the first metal layer. A second complement bit-line coupled to the first complement bit-line, and the second complement bit-line is disposed on the second metal layer. A word line coupled to a row of the array of memory cells.

A memory device is also described including a memory cell having a pass-gate transistor. A first bit-line is connected to a drain node of the pass-gate transistor. A second bit-line is connected to the first-bit line through a via. One of the first and second bit-lines extends to a control circuitry for the memory device.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a memory device comprising:
   providing a substrate having a pass-gate transistor in a first region and control circuitry in a peripheral region;
   forming a first conductive via extending from a drain region of the transistor;
   depositing a first metal line above the transistor, wherein the first metal line is operable to carry a first bit-line signal to the drain region via the first conductive via;
   forming a second conductive via extending above and connected to the first metal line;
   after depositing the first metal line, depositing a second metal line connected to the first metal line through the second conductive via; and
   wherein at least one of the first and second metal lines extends to the control circuitry for the memory device;
   depositing a third metal line;
   forming a third conductive via to a gate of the transistor, wherein the third conductive via is electrically connected to the third metal line; and
   depositing a fourth metal line, wherein the fourth metal line is connected to the third metal line by a fourth conductive via, wherein one of the third or fourth metal lines extends to the control circuitry for the memory device.

2. The method of forming the memory device of claim 1, wherein the second conductive via is formed after the first metal line and prior to the second metal line.

3. The method of forming the memory device of claim 1, further comprising:
   sending a word line signal on the third metal line and the fourth metal line.

4. The method of forming the memory device of claim 1, further comprising:
   forming an inter-layer dielectric (ILD) layer between the third metal line and the fourth metal line.

5. The method of forming the memory device of claim 1, wherein the second conductive via and one of the first metal line or the second metal line are formed in a damascene process.

6. The method of forming the memory device of claim 1, further comprising:
   sending a same signal on the first metal line and the second metal line.

7. A method of providing a memory device comprising:
   forming a transistor having a gate structure interposing a drain region and a source region, wherein the gate structure on a semiconductor substrate;
   depositing a first metal line of a first metal layer of a multi-layer interconnect (MLI) structure, wherein the first metal line extends horizontally on the first metal layer and is connected to the drain region;
   forming a first conductive via connected to and extending above the first metal line;
   depositing a landing pad above the first conductive via, wherein the landing pad is disposed on a second metal layer of the MLI structure;
   forming a second conductive via connected to and extending above the landing pad;
   depositing a second metal line above and connected to the second conductive via, the second metal line extending horizontally on a third metal layer of the MLI structure; and
   providing a signal to/from the drain region on each of the first metal line and the second metal line to control circuitry.

8. The method of claim 7, wherein the first conductive via and the second conductive via are vertically aligned.

9. The method of claim 7, further comprising: depositing an inter-layer dielectric (ILD) between the first metal layer and the second metal layer, wherein the ILD surrounds four sides of the landing pad having a rectangular shape.

10. The method of claim 7, wherein the first metal line and the second metal line extend in a same direction, the second metal line being directly over the first metal line.

11. The method of claim 7, further comprising: forming a third metal line coplanar with the landing pad, wherein the third metal line is coupled to the transistor.

12. A method of forming a memory device comprising:
providing a substrate having a transistor in a first region and control circuitry in a peripheral region;
forming a first via extending from a drain region of the transistor;
depositing a first metal line above the first via, wherein the first metal line is operable to carry a first bit-line signal to the drain region via the first via;
forming a second via extending above and connected to the first metal line;
after depositing the first metal line, depositing a second metal line connected to the second conductive via, wherein at least one of the first metal line or the second metal line extends to the control circuitry for the memory device;
forming a third metal line electrically connected to a gate of the transistor; and
forming a fourth metal line, wherein the fourth metal line is connected to the third metal line by a third via, wherein one of the third or fourth metal lines extends to the control circuitry for the memory device.

13. The method of claim 12, wherein the forming the first metal line includes depositing conductive material into patterned openings in a dielectric material.

14. The method of claim 12, wherein depositing the first metal line includes depositing copper.

15. The method of claim 12, further comprising: preparing a layout of the memory device such that a read or write operation of a memory cell comprising the transistor provides the first metal line and the second metal line at a same state and the third metal line and the fourth metal line at a same state.

16. The method of claim 12, wherein the forming the third metal line forms the third metal line above the first metal line and below the second metal line.

17. The method of claim 16, wherein the forming the fourth metal line includes forming the fourth metal line above the second metal line.

18. The method of claim 12, further comprising: forming a fourth metal line, wherein the fourth metal line is above the second metal line, the fourth metal line coupled to the third metal line.

* * * * *